United States Patent
Dubrulle et al.

(10) Patent No.: US 11,162,999 B2
(45) Date of Patent: Nov. 2, 2021

(54) DEVICE AND SYSTEM FOR TESTING MAGNETIC DEVICES

(71) Applicant: Melexis Technologies SA, Bevaix (CH)

(72) Inventors: Olivier Dubrulle, Zermezeele (FR); Marie Dlevaque, Lomme (FR); Pierre Letousey, Grandcamp-Maisy (FR)

(73) Assignee: MELEXIS TECHNOLOGIES SA, Bevaix (CH)

( * ) Notice: Subject to any disclaimer, the term of this patent is extended or adjusted under 35 U.S.C. 154(b) by 173 days.

(21) Appl. No.: 16/563,403

(22) Filed: Sep. 6, 2019

(65) Prior Publication Data

US 2020/0081057 A1 Mar. 12, 2020

(30) Foreign Application Priority Data

Sep. 6, 2018 (EP) ..................... 18192865

(51) Int. Cl.
*G01R 31/28* (2006.01)
*G01K 13/00* (2021.01)
(Continued)

(52) U.S. Cl.
CPC ......... *G01R 31/2881* (2013.01); *G01K 13/00* (2013.01); *G01R 33/06* (2013.01);
(Continued)

(58) Field of Classification Search
CPC .... G01R 31/2881; G01R 35/00; G01R 33/06; G01R 33/093; G01R 31/2872;
(Continued)

(56) References Cited

U.S. PATENT DOCUMENTS 5,433,717 A * 7/1995 Rubinsky ............... A61B 18/02
600/411
2012/0229129 A1* 9/2012 Kochergin ........... G01R 33/093
324/244
(Continued)

FOREIGN PATENT DOCUMENTS

CN 103901381 A * 7/2014 ............... H01F 7/20
CN 103901381 A 7/2014

OTHER PUBLICATIONS

Sun et al,. "A 3D Coil Structure Achieving Uniform Magnetic Field for In-Vitro Cell Experiments," 2017 International Symposium on Electromagnetic Compatibility, EMC Europe, 2017, 4 Pages.
(Continued)

*Primary Examiner* — Akm Zakaria
(74) *Attorney, Agent, or Firm* — Workman Nydegger

(57) ABSTRACT

A coil arrangement for generating a configurable 3D magnetic field vector inside a cavity, comprises a solenoid forming the cavity and having a first axis, a first pair of coils having a second common axis, and a second pair of coils having a third common axis, the three axes intersecting in a point where a chip to be tested is to be located. A test arrangement further comprises a container for holding a liquid and having at least one opening for providing access to the at least one cavity. A test system further comprises an electrical unit with a plurality of current sources, and a mechanical positioning mechanism for placing and holding the chip to be tested.

27 Claims, 15 Drawing Sheets

(51) Int. Cl.
  *H01F 27/28* (2006.01)
  *G01R 35/00* (2006.01)
  *H01F 7/20* (2006.01)
  *G01R 33/06* (2006.01)

(52) U.S. Cl.
  CPC ............... *G01R 35/00* (2013.01); *H01F 7/20* (2013.01); *H01F 27/28* (2013.01)

(58) Field of Classification Search
  CPC .... G01R 31/2896; G01K 13/00; H01F 27/28; H01F 7/20
  See application file for complete search history.

(56) References Cited

U.S. PATENT DOCUMENTS

2013/0038321 A1* 2/2013 Suzuki ............... G01R 33/0035
  324/224
2019/0335983 A1* 11/2019 Duan ................... G01R 33/072

OTHER PUBLICATIONS

European Search Report from EP Application No. 18192865, dated Feb. 11, 2019.

\* cited by examiner $$\begin{cases} I_x = \alpha_x \cdot B_x + \beta_x \cdot B_y + \gamma_x \cdot B_z + \varepsilon_x & (1) \\ I_y = \alpha_y \cdot B_x + \beta_y \cdot B_y + \gamma_y \cdot B_z + \varepsilon_y & (2) \\ I_z = \alpha_z \cdot B_x + \beta_z \cdot B_y + \gamma_z \cdot B_z + \varepsilon_z & (3) \\ \quad I_{xm} = I_x \cdot K_x & (4) \\ \quad I_{ym} = I_y \cdot K_y & (5) \end{cases}$$

FIG 11(a)

$$\begin{cases} B_x^{csi} = k_{xx}^{csi} \cdot I_x + k_{xy}^{csi} \cdot I_y + k_{xz}^{csi} \cdot I_z + koff_x^{csi} & (6) \\ B_y^{csi} = k_{yx}^{csi} \cdot I_x + k_{yy}^{csi} \cdot I_y + k_{yz}^{csi} \cdot I_z + koff_y^{csi} & (7) \\ B_z^{csi} = k_{zx}^{csi} \cdot I_x + k_{zy}^{csi} \cdot I_y + k_{zz}^{csi} \cdot I_z + koff_z^{csi} & (8) \end{cases}$$

FIG 11(b)

$$\begin{bmatrix} k_{xx} & k_{xy} & k_{xz} \\ k_{yx} & k_{yy} & k_{yz} \\ k_{zx} & k_{zy} & k_{zz} \end{bmatrix} = \begin{bmatrix} 2.445\text{E}+00 & 3.458\text{E-}02 & -2.540\text{E-}05 \\ 7.376\text{E-}02 & 2.239\text{E}+00 & -4.240\text{E-}05 \\ 1.680\text{E-}05 & -2.100\text{E-}05 & 7.012\text{E}+00 \end{bmatrix}$$
(in mT/A)

FIG 11(c)

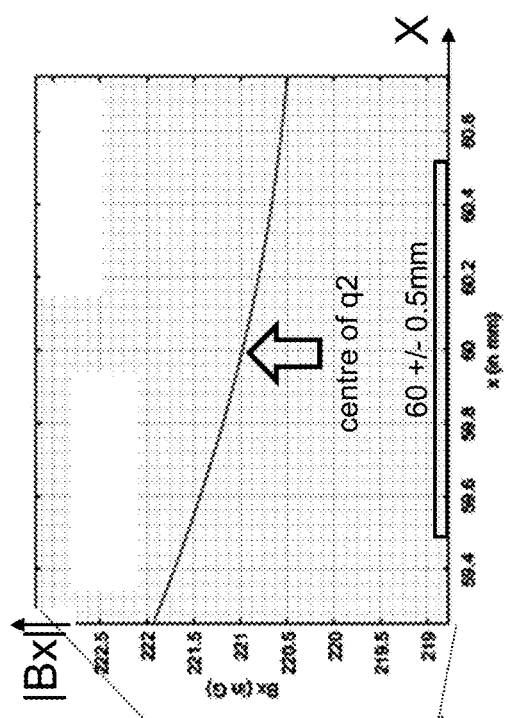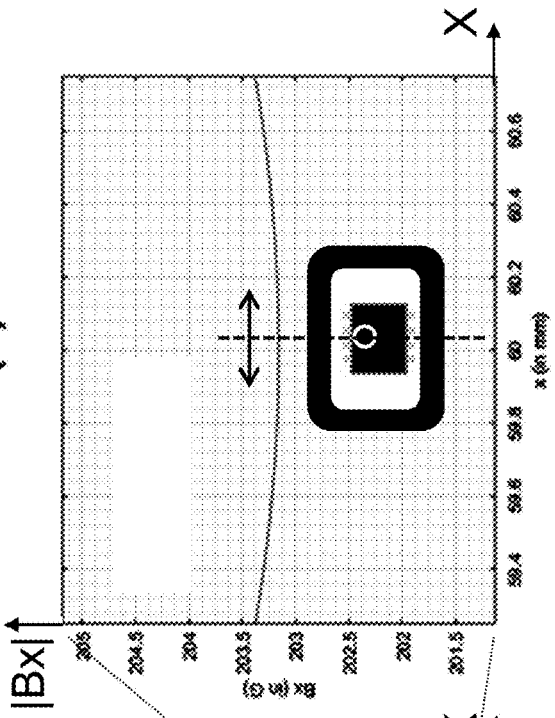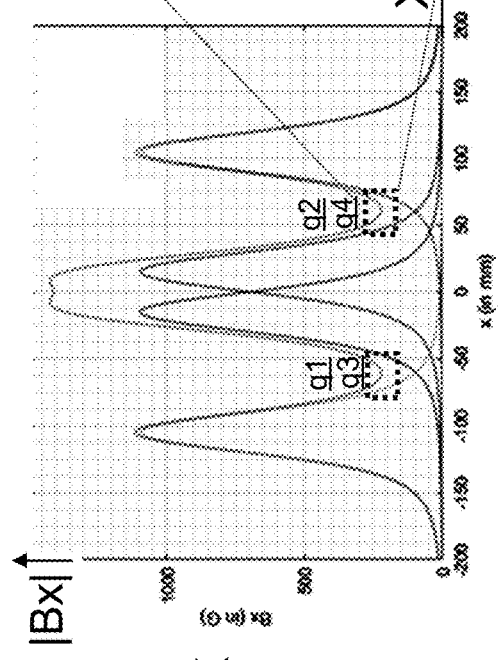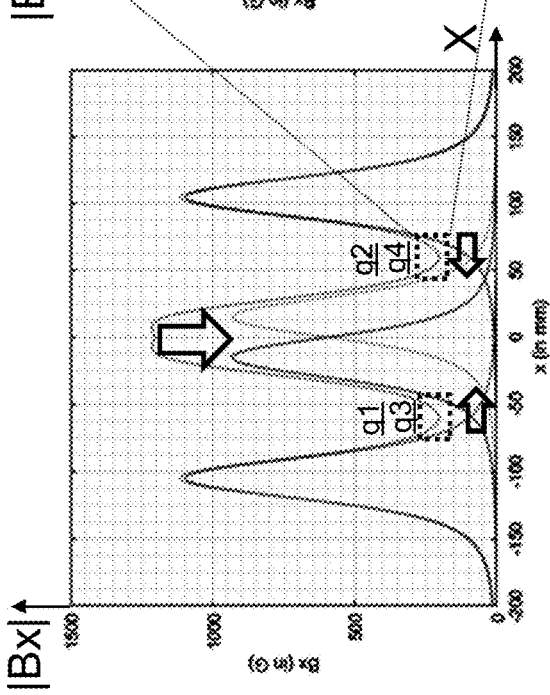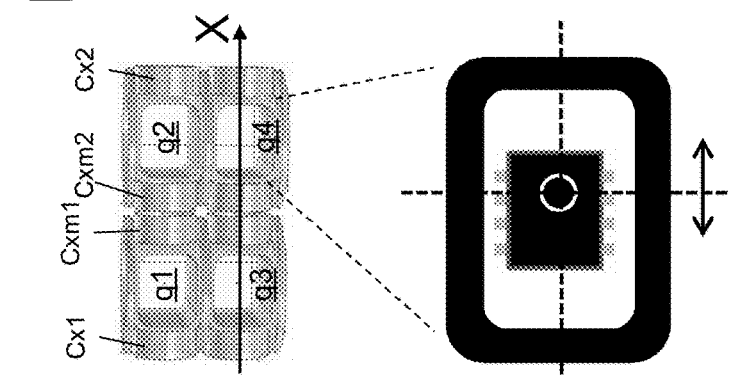

DEVICE AND SYSTEM FOR TESTING MAGNETIC DEVICES

FIELD OF THE INVENTION

The present invention relates in general to the field of devices and systems for generating a 3D-magnetic field, and more in particular to devices and systems for testing packaged integrated circuits in a production environment.

BACKGROUND OF THE INVENTION

FIG. 1 shows an example of an integrated circuit comprising one or more magnetic sensor elements, for example horizontal or vertical Hall elements or Giant Magneto Resistors (GMR), etc. Such devices may for example be used for linear or angular position sensing in automotive applications. Integrated circuits for automotive applications are typically designed to function in a broad temperature range from about −40° C. to about +160° C. In order to obtain good working devices, it is common in the semiconductor industry to perform different tests at various stages of production, for example some tests are performed at wafer level before dicing, while other tests are performed after dicing and packaging.

The present invention is related to methods and systems for functionally testing packaged IC's, for example CMOS devices comprising one or more magnetic sensor elements, for example packaged in a TSSOP16 package (5.0 mm×6.4 mm×1.0 mm). In order to adequately test such devices, various magnetic field vectors are to be generated by the equipment and measured by the device, at different temperatures, with high accuracy. Moreover, in a production environment high test coverage, high throughput, low maintenance cost, low down-time etc. are also very important.

US20120229129A1 describes a probing station with magnetic measurement capabilities, for testing wafers before dicing, by making use of probes brought into contact with the wafer surface. Such equipment can however not be used for testing the packaged devices, as described above.

SUMMARY OF THE INVENTION

It is an object of embodiments of the present invention to provide a coil arrangement which can be used to provide a 3D-magnetic field of any orientation to one or more packaged semiconductor device.

It is also an object of embodiments of the present invention to provide a test arrangement comprising such coil arrangement configured for creating various environmental conditions to the packaged semiconductor device, e.g. in terms of magnetic field and/or temperature.

It is also an object of embodiments of the present invention to provide a test system comprising such a coil arrangement or such a test arrangement, and further comprising an electrical unit adapted for providing suitable currents to the coils.

It is a particular object of embodiments of the present invention to provide a compact coil arrangement configured for generating a magnetic field of at least 1 mTesla in any 3D orientation, or at least 2 mTesla in any 3D orientation, or at least 5 mT in any 3D orientation, or at least 10 mT in any 3D orientation, or at least 15 mT in any 3D orientation, or at least 20 mT in any 3D orientation, or at least 25 mTesla in any 3D orientation, or at least 30 mTesla in any orientation, preferably without a significant amount of hysteresis.

It is a particular object of embodiments of the present invention to provide a test arrangement configured for allowing the packaged devices to be tested at a plurality of predefined temperatures.

It is a particular object of embodiments of the present invention to provide a coil arrangement and a test arrangement and a test system configured for simultaneously generating 2 or 4 configurable magnetic field vectors at 2 or 4 locations, for simultaneously testing 2 or 4 packaged devices.

It is an object of particular embodiments of the present invention to provide a test system configured for providing a magnetic field having a configurable field vector at one or more test locations, each test location being adapted for receiving a packaged semiconductor device to be tested, the magnetic field having an improved homogeneity at said one or more test locations.

It is an object of particular embodiments of the present invention to provide a test system configured for providing a magnetic field having a configurable field vector at one or more test locations, each test location being adapted for receiving a packaged semiconductor device to be tested, wherein the exact location where the magnetic field has optimal homogeneity is configurable, for example dependent on the specific package of the packaged device to be tested.

It is an object of particular embodiments of the present invention to provide a test system configured for generating a magnetic field having predefined magnetic field vectors at 2 or 4 test locations for simultaneously testing 2 or 4 packaged devices at a reduced energy consumption, without decreasing the magnetic field strength.

It is a specific object of a preferred embodiment of the present invention to provide a test system configured for simultaneously testing 2 or 4 packaged devices, using an existing handling machine having specific dimensions, the handling machine having a plurality of movable arms for moving said packaged devices towards the test locations, and for holding them during the test.

These objectives are accomplished by a coil arrangement and a test arrangement and a test system according to embodiments of the present invention.

According to a first aspect, the present invention provides a coil arrangement for generating a magnetic field with a configurable 3D magnetic field vector at a predefined location inside a cavity inside the coil arrangement, the cavity being adapted for receiving a device to be tested and having an opening for allowing insertion and removal of said device, the coil arrangement comprising: a first coil in the form of a solenoid having a tubular shape forming or surrounding the cavity, the first coil having a first axis oriented in a first direction and being adapted for generating a first magnetic field component in the first-direction at said predefined location; a second coil and a third coil arranged on opposite sides of the cavity, the second and third coil having a common axis oriented in a second direction perpendicular to the first direction, the second and third coil being adapted for generating a second magnetic field component in the second direction at said predefined location; a fourth coil and a fifth coil arranged on opposite sides of the cavity, the fourth and fifth coil having a common axis oriented in a third direction perpendicular to the first direction and perpendicular to the second direction, the fourth and fifth coil being adapted for generating a third magnetic field component in the third direction at said predefined location.

It is an advantage of this coil arrangement that it does not contain mechanically moving parts (e.g. no movable magnets). It is a static structure, where the coils are stationary with respect to one another. This has a significant impact on maintenance costs.

It is an advantage of this coil arrangement that it allows to generate a 3D magnetic field at the test-location (inside the cavity). In some embodiments, the coil arrangement allows to generate a magnetic field having a strength of at least 10 mTesla, or at least 15 mTesla or even at least 20 mTesla in any direction.

It is an advantage of this coil arrangement that it allows to create a 3D magnetic field with a configurable field vector at the test-location (inside the cavity) in a very fast way, e.g. within 5 ms. This means that in a given test-time, more test-vectors can be applied and measured, thereby increasing the chance of detecting errors, and thus improving the reliability of the product. Or stated in other words, for a given set of test-vectors, the test-time can be reduced, thus the throughput can be increased.

It is an advantage of this coil arrangement that it allows to generate a highly homogeneous 3D magnetic field, and thus allows highly accurate measurements.

It is an advantage of this coil arrangement that it addresses several conflicting requirements, for example: being compact and providing a (relatively large) opening (or access window) for allowing insertion of a packaged device.

It is an advantage that the coils have orthogonal axis.

This coil arrangement is particularly suited for testing packaged IC's in a production environment.

In an embodiment the coil arrangement comprises only nonferromagnetic metals or alloys.

In other words, the coil arrangement does not contain ferromagnetic metals or alloys, but may comprise other materials as well, such as plastics. It is a major advantage of such a coil arrangement that it has no hysteresis, or no significant amount of hysteresis.

Preferably the first coil has a rectangular cross section or a substantially rectangular cross section with a width larger than a height, or wherein the first coil has an elliptical or substantially elliptical cross section with a minor axis and a major axis.

Preferably each of the second, third, fourth and fifth coil has a cylindrical shape or a ring shape.

In an embodiment, each of the second and third coil has a cylindrical shape or a ring shape with an outer diameter, and a length smaller than 80% or smaller than 70% or smaller than 60% or smaller than 50% of the outer diameter; and each of the fourth and fifth coil has a cylindrical shape or a ring shape with an outer diameter, and a length smaller than 20% or smaller than 15% or smaller than 10% of the outer diameter.

In an embodiment, the fourth coil and the first coil and the fifth coil are stacked along the third axis, and an outer diameter of the fourth and fifth coil is at least 80% or at least 90% of an outer width of the first coil; and said stack is sandwiched in the second direction between the second and third coil, an outer diameter of the second and third coil being at least 80% or at least 90% of a height of the stack in the second direction.

This is one way of stacking the five (or more) coils in a very compact manner.

In an embodiment, the second coil and the first coil and the third coil are stacked along the second axis, and an outer diameter of the second and third coil is at least 80% or at least 90% of an outer height of the first coil; and said stack is sandwiched in the third direction between the fourth and fifth coil, an outer diameter of the fourth and fifth coil being at least 80% or at least 90% of an outer width of the stack in the third direction.

This is another way of stacking the five (or more) coils in a very compact manner.

In an embodiment, the coil arrangement is adapted for furthermore generating a second configurable 3D magnetic field vector at a second predefined location inside a second cavity, the second cavity having a shape and size for accommodating a second device to be tested and having a second opening for allowing insertion or removal of said second device; the coil arrangement further comprising: a sixth coil in the form of a solenoid having a tubular shape forming or surrounding the second cavity, the sixth coil having an axis parallel to the first direction, and being arranged between the first coil and the fifth coil; and a seventh coil and an eight coil arranged on opposite sides of the second cavity, each of these coils having an axis oriented in the second direction; and at least one intermediate coil arranged between the first coil and the sixth coil, the at least one intermediate coil and the fourth coil and the fifth coil having a common axis.

The sixth coil Cz' is configured for generating a magnetic field component Bz2 oriented in the first direction (Z) at said second location. The seventh and eight coil Cx1', Cx2' are adapted for generating a magnetic field component Bx2 oriented in the second direction (X) at said second location. In operation, the at least one intermediate coil Cym cooperates with the fourth coil Cy1 and the fifth coil Cy2 for generating the magnetic field component By1 at the first test location and the magnetic field component By2 at said second location.

The opening is also referred to herein as "access window".

In an embodiment, the coil arrangement is adapted for furthermore generating a second configurable 3D magnetic field vector at a second predefined location inside a second cavity, the second cavity having a shape and size for accommodating a second device to be tested and having a second opening for allowing insertion or removal of said second device; the coil arrangement further comprising: a sixth coil in the form of a solenoid having a tubular shape forming and/or surrounding the second cavity, the sixth coil having an axis parallel to the first direction, and being arranged between the first coil and the third coil; and a seventh coil and an eighth coil arranged on opposite sides of the second cavity, each of these coils having an axis oriented in the third direction; and at least one intermediate coil arranged between the first coil and the sixth coil, the at least one intermediate coil and the second coil and the third coil having a common axis.

The sixth coil Cz' is configured for generating a magnetic field component Bz2 oriented in the first direction (Z) at said second location. The seventh and eight coil Cx1', Cx2' are adapted for generating a magnetic field component By2 oriented in the third direction (Y) at said second location. In operation, the at least one intermediate coil cooperates with the second coil Cx1 and the third coil Cx2 for generating the magnetic field component Bx1 at the first test location and the magnetic field component Bx2 at said second location.

The opening is also referred to herein as "access window".

In an embodiment, the coil arrangement is further adapted for generating a second, third and fourth configurable 3D magnetic field vector at a second, third and fourth predefined location inside a second, third and fourth cavity, each of the cavities having a shape and size for accommodating a respective device to be tested, and having a respective opening for allowing insertion or removal of said device; the coil arrangement further comprising: a sixth coil in the form of a solenoid having a tubular shape forming or surrounding the second cavity, the sixth coil having an axis parallel to the first direction, and being arranged between the first coil and the third coil; and a seventh coil and an eight coil arranged on opposite sides of the second cavity, each of these coils having an axis oriented in the third direction; and at least one first intermediate coil arranged between the first coil and the sixth coil having a common axis with the second coil and the third coil; and a ninth coil in the form of a solenoid having a tubular shape forming or surrounding the third cavity, the ninth coil having an axis parallel to the first direction, and being arranged between the first coil and the fifth coil; and a tenth coil and an eleventh coil arranged on opposite sides of the third cavity, each of these coils having an axis oriented in the second direction; and at least one second intermediate coil arranged between the first coil and the ninth coil, the second intermediate coil and the fourth coil and the fifth coil having a common axis; and a twelfth coil in the form of a solenoid having a tubular shape forming and/or surrounding the fourth cavity, the twelfth coil having an axis parallel to the first direction, and being arranged between the ninth coil and the eleventh coil; and—at least one third intermediate coil arranged between the ninth coil and the twelfth coil, the at least one third intermediate coil and the tenth coil and the eleventh coil having a common axis; and—at least one fourth intermediate coil arranged between the sixth coil and the twelfth coil, at least one fourth intermediate coil and the seventh coil and the eighth coil having a common axis.

The seventh and eight coil Cy1', Cy2' are adapted for generating a magnetic field component in the third direction at said second location. The tenth and eleventh coil are adapted for generating a magnetic field component in the second direction at said third location. The one or more first intermediate coil is adapted for cooperating with the second coil and the third coil for generating magnetic field components at said first location and a second magnetic field component at said second location, both oriented in the second direction. The one or more second intermediate coil is adapted for cooperating with the fourth coil and the fifth coil for generating the magnetic field component at said first location and a magnetic field component at said third location, both oriented in the third direction. The one or more third intermediate coil is adapted for cooperating with the tenth coil and the eleventh coil for generating the magnetic field component at the third location and a magnetic field component at the fourth location, both oriented in the second direction. The one or more fourth intermediate coil is adapted for cooperating with the seventh coil and the eighth coil for generating magnetic field components at the second location and a magnetic field component By4 at the fourth location.

According to a second aspect, the present invention also provides a test arrangement comprising: a coil arrangement according to the first aspect; and a container having a size and dimensions for accommodating the coil arrangement, and being adapted for furthermore containing a liquid for increasing and/or decreasing a temperature of the coil arrangement; the container having at least one wall comprising at least one opening for providing access to the at least one cavity.

Preferably the container has at least two wall panels or walls or wall sections, on opposite sides of the coil arrangement, for providing access to both sides of the solenoids. It is an advantage that one side can be used for introducing packaged devices, and the other side can be used for making electrical contact with the device, for performing measurements.

In an embodiment, the test arrangement does not comprise ferro-magnetic metals or alloys, or in other words, only comprises nonferromagnetic metals or alloys, and optionally other materials such as plastics.

It is an advantage that this improves linearity of the system by decreasing hysteresis.

In an embodiment, the test arrangement further comprises internal or external temperature control means for controlling a temperature of the liquid inside the container.

Any known temperature control means can be used. The temperature control means may comprise a temperature sensor for measuring a temperature of the liquid inside the container. The temperature control means may e.g. comprise and/or control a valve for allowing water from an external water supply (e.g. tap water or distribution water) to enter the container to mix with the liquid in the container. Alternatively, or additionally, the temperature control means may further comprise a heat exchanger for allowing external water to flow through a conduit, and to exchange heat with the liquid inside the container. But other temperature control means for cooling or heating the liquid in the container may also be used.

According to a third aspect, the present invention also provides a test system comprising: a coil arrangement according to the first aspect, or a test arrangement according to the second aspect; and an electrical unit for providing a plurality of currents to said coils for generating the at least one configurable magnetic field vector at said predefined location inside said at least one cavity, the electrical control unit comprising: a first current source adapted to provide a first selectable or configurable current in at least the first coil for generating a magnetic component oriented in the first direction; and a second current source adapted to provide a second selectable or configurable current in at least the second and third coil for generating a magnetic field component oriented in the second direction; and a third current source adapted to provide a third selectable or configurable current in the fourth and fifth coil for generating a magnetic field component oriented in the third orientation; and a controller for controlling the first, second and third current source so as to generate at least a first configurable magnetic field vector at the first predefined position inside the first cavity.

In an embodiment, the test system further comprises at least one magnetic sensor arranged in each cavity, preferably at least two or at least three magnetic sensor in each cavity.

By reading this magnetic sensor, the controller can measure the actual magnetic field strength and orientation of the magnetic field inside the at least one cavity, and can use this information to improve accuracy of the orientation and/or field strength, and/or to detect errors and/or disturbances.

In an embodiment, the test system comprises a coil arrangement having the features of claim 6 as filed and/or as shown in FIG. 6; and the first current source is further adapted for also providing the first current to the sixth coil; and the second current source is further adapted for also providing the second current to the seventh coil and eighth coil; and the test system further comprises a fourth current source for providing a fourth selectable or configurable current to the at least one intermediate coil; and the controller is further adapted for controlling the current sources for simultaneously generating a first magnetic field vector at the first predefined position inside the first cavity and a second magnetic field vector at the second predefined position inside the second cavity.

The controller is preferably adapted for controlling the current sources such that the magnitude |Bx2| is substantially equal to the magnitude |Bx1|; and wherein the magnitude |By2| is substantially equal to the magnitude |By1|, but the orientation may be the same or opposite; and wherein the magnitude |Bz2| is substantially equal to the magnitude |Bz1|, but the orientation may be the same or opposite, for reasons illustrated in FIG. 16.

In an embodiment, the test system comprises a coil arrangement having the features of claim 7 as filed and/or as shown in FIG. 8; and the first current source is further adapted for also providing the first current to the sixth coil; and the third current source is further adapted for also providing the third current to the seventh coil and eighth coil; and the test system further comprises a fourth current source for providing a fourth selectable or configurable current to the at least one intermediate coil; and the controller is further adapted for controlling the current sources for simultaneously generating a first magnetic field vector at the first predefined position inside the first cavity and a second magnetic field vector at the second predefined position inside the second cavity.

The controller is preferably adapted for controlling the current sources such that the magnitude |Bx2| is substantially equal to the magnitude |Bx1|, but the orientation may be the same or opposite; and wherein the magnitude |By2| is substantially equal to the magnitude |By1|, but the orientation may be the same or opposite; and wherein the magnitude |Bz2| is substantially equal to the magnitude |Bz1|, but the orientation may be the same or opposite, for reasons illustrated in FIG. 16.

In an embodiment, the test system comprises a coil arrangement having the features of claim 8 as filed and/or as shown in FIG. 10; and the first current source is further adapted for also providing the first current to the sixth, ninth and twelfth coil; and the second current source is further adapted for also providing the second current to the tenth and eleventh coil; and the third current source is further adapted for also providing the third current in the seventh and eighth coil; and the test system further comprises a fourth current source for providing a fourth current to the at least one first intermediate coil and to the at least one third intermediate coil; wherein the test system further comprises a fifth current source for providing a fifth current to the at least one second intermediate coil and to the at least one fourth intermediate coil; and the controller is further adapted for controlling the current sources for simultaneously generating a first magnetic field vector at the first predefined position inside the first cavity, and a second magnetic field vector at the second predefined position inside the second cavity, and a third magnetic field vector at the third predefined position inside the third cavity, and a fourth magnetic field vector at the fourth predefined position inside the fourth cavity, The controller is preferably adapted for controlling the current sources such that the magnitudes |Bx2|, |Bx3| and |Bx4| are substantially equal to the magnitude |Bx1|, but the orientation may be the same or opposite; and such that the magnitudes |By2|, |By3| and |By4| are substantially equal to the magnitude |By1|, but the orientation may be the same or opposite; and such that the magnitudes |Bz2|, |Bz3| and |Bz4| are substantially equal to the magnitude |Bz1|, but the orientation may be the same or opposite, for reasons illustrated in FIG. 16.

In an embodiment, the controller is further adapted for controlling the current sources for adjusting the physical location inside the first, second, third and fourth cavity where the second magnetic field components have a local minimum, in the second direction.

In an embodiment, the controller is further adapted for controlling the current sources for adjusting the physical location inside the first, second, third and fourth cavity where the third magnetic field components have a local minimum, in the third direction.

In an embodiment, the test system further comprises one or more of the following features:
  i) wherein the test system is further adapted such that the first magnetic field component in the first cavity is oriented in the same direction as the first magnetic field component in the fourth cavity, and is oriented in the opposite direction as the first magnetic field component in the second and third cavity; or
  ii) wherein the test system is further adapted such that the first magnetic field component in the first cavity is oriented in the same direction as the first magnetic field component in the third cavity, and is oriented in the opposite direction as the first magnetic field component in the second and fourth cavity;
  iii) wherein the test system is further adapted such that the second magnetic field component in the first cavity is oriented in the same direction as the second magnetic field component in the second cavity, and is oriented in the opposite direction as the second magnetic field component in the third and fourth cavity;
  iv) wherein the test system is further adapted such that the third magnetic field component in the first cavity is oriented in the same direction as the third magnetic field component in the third cavity, and is oriented in the opposite direction as the third magnetic field component in the second and fourth cavity.

In an embodiment, the test system further comprises a positioning mechanism having at least one movable element comprising a holder for holding a device to be tested, and for selectively moving the holder toward the predefined location inside the at least one cavity or away from the cavity.

The movable element may be a movable arm. The positioning system may be or may comprise a gripping device.

In a preferred embodiment, the positioning mechanism (e.g. chip handler) has at least four movable elements or movable arms, adapted for simultaneously holding four packaged devices to be tested, and for simultaneously inserting these devices inside a respective one of four cavities, and for simultaneously retracting the devices from the four cavities.

In an embodiment, the controller is adapted for performing at least some, but preferably all of the following steps: a) instructing the positioning mechanism to take a new device to be tested; b) instructing the positioning mechanism to control a local temperature of the device to be tested; c) instructing the positioning mechanism to insert the device into the at least one cavity; d) instructing the internal or external temperature control means of the test arrangement to control a temperature of the test arrangement; e) for each of a plurality of a predefined magnetic test vectors, i) calculating a plurality of currents that need to be applied to the coils to obtain said at least one magnetic test vector; ii) applying the calculated plurality of currents to the coils, thereby generating the at least one magnetic test vector inside the at least one cavity; iii) allowing the device to measure the magnetic field vector inside the respective cavity and/or to determine a value derived therefrom; iv)

communicating with the device in order to obtain the measured vector data or the determined value from the device; v) comparting the obtained vector data or the determined value with a predefined result for the specific test vector, and deciding whether the device has passed or failed the test; f) instructing the positioning mechanism to remove the device which has been tested.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 9 shows the dimensions and relative positions of four "access windows" for allowing an existing handler (or "device positioner") to simultaneously insert four chip packages into or retracting them from four test locations.

FIG. 10 (bottom) shows an electrical unit for providing currents to the coils of the coil arrangement, together forming a test system.

FIG. 11(a) shows a set of formulas that may be used by the electronic unit of FIG. 10 for determining the currents to be applied to the coils in order to generate a magnetic field having specific characteristics at the test locations inside the cavities, where the packaged devices are to be positioned during testing.

FIG. 11(b) shows a set of formulas that may be used by the electronic unit of FIG. 10 for determining the magnetic field generated inside the cavities when applying a given set of currents to the coils.

FIG. 11(c) shows an exemplary set of coefficients as may be used in the formulas of FIG. 11(b).

FIG. 14(a) shows plots of the magnitude of the magnetic field component Bx at various positions along the X-axis, if the outer X-coils and the intermediate X-coils carry the same current.

FIG. 14(b) shows an enlarged portion of the magnetic field component Bx at the test-location(s) (where the device is/are to be positioned during testing), showing a non-homogeneous field at the test-location, but a field having a non-zero dBx/dx field gradient.

FIG. 14(c) shows plots of the magnitude of the magnetic field component Bx at various positions along the X-axis, if the intermediate X-coils carry a smaller current than the outer X-coils (e.g. in the range from about 70% to about 95% thereof), as is used in some embodiments of the present invention.

FIG. 14(d) shows an enlarged portion of the magnetic field component Bx at the test-location (where the device is to be positioned during testing), showing a highly homogeneous field having a reduced or substantially zero dBx/dx field gradient.

FIG. 14(e) illustrates how a more homogeneous Bx field-component can be generated at the test locations inside the cavities of the coil arrangement of FIG. 10.

Figure 1:
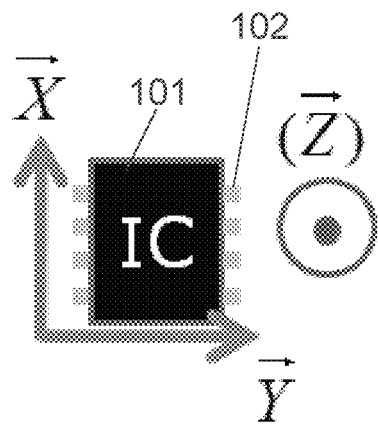
FIG. 1 is a drawing showing a classical chip-package and three orthogonal axes typically associated with such a package: an X-axis showing a longitudinal direction, a Y-axis showing a transverse direction, a Z-axis showing a direction perpendicular to the plane of the semiconductor device. The X- and Y-axis are also referred to as "in-plane" axes.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are configured for operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are configured for operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention is related to devices and systems and methods for generating a 3D-magnetic field for testing packaged integrated circuits in a production environment, for example linear or angular position sensor devices for automotive applications. In order to obtain good working devices, various tests are performed at various stages of production of the devices. For example, some tests are performed early in the production process, on wafer level before dicing and before packaging. Other tests are performed late in the production process, e.g. after dicing and after packaging. Typically, different test equipment is needed for the various stages.

The present invention is related to methods and systems for functionally testing packaged IC's, for example CMOS devices comprising one or more magnetic sensor elements. The devices may be packaged for example in a TSSOP16 package (5.0 mm×6.4 mm×1.0 mm), but the present invention is not limited thereto, and other standard or proprietary packages may also be used.

In order to test magnetic sensitive devices, typically a magnetic field with specific characteristics is applied to the device, and one or more of these characteristics is/are measured by the device. The measured characteristics are then compared with the applied characteristics, and if the result lies (or results ly) in a predefined tolerance margin, the device is considered to function correctly.

Classically, the inventors used a mechanical test equipment, where a plurality of permanent magnets were brought in the vicinity of the device(s) to be tested using actuators such as electrical motors and/or pistons. Four devices to be tested were held by a so called "handler", and were brought to specific test locations (also referred to herein as "test sites"). Although this system has served well for many years, it has several drawbacks, inter alia that the magnetic field applied could be well defined in 2D (the in-plane component Bx and By) but not in 3D (the Bz component), the system was difficult to maintain or adjust, mechanical repositioning of the permanent magnets was relatively slow (or test time relatively high), and mechanical tolerances were relatively high (or accuracy is relatively low), etc.

There was clearly a need for a test-system that overcomes at least some of these and other problems, but a simple and compact solution capable of providing a 3D magnetic field vector (Bx, By, Bz) that can be easily generated, and that is sufficiently strong (e.g. at least 1 mTesla in any desired direction, or at least 2 mTesla in any desired direction, or at least 5 mT in any desired directions, or at least 10 mT in any desired direction, or at least 15 mT in any desired direction, or at least 20 mT in in any desired direction, or at least 25 mT in any desired direction, or at least 30 mT in any desired direction), does not seem to exist.

Over the years many designs were considered, but no good solution was found. Especially the conflicting requirements of compactness (e.g. the critical parts of the system should preferably fit in an imaginary box of about 50 cm×50 cm×50 cm), and sufficiently strong magnetic field (e.g. at least 1 mT, or at least 2 mT, or at least 5 mT, or at least 10 mT, or at least 15 mT, or at least 20 mT, or at least 25 mT, or at least 30 mT in any predefined direction) and high homogeneity (e.g. the magnetic field values Bx, By, Bz should not deviate more than 0.2% if the packaged chip is shifted over +/−0.50 mm in any direction) seemed impossible to overcome, until the inventors came to the idea of providing a coil arrangement for generating a magnetic field with a configurable 3D magnetic field vector at a predefined location inside a cavity inside the coil arrangement, the cavity being adapted for receiving a device to be tested and having at least one opening for allowing insertion and removal of said device, the coil arrangement comprising:

a first coil Cz in the form of a solenoid having a tubular shape forming or surrounding the cavity q1, the first coil Cz having a first axis oriented in a first direction Z and being adapted for generating a first magnetic field component Bz in the first-direction Z at said predefined location;

a second coil Cx1 and a third coil Cx2 arranged on opposite sides of the cavity q1, the second and third coil having a common axis (X) oriented in a second direction perpendicular to the first direction Z, the second and third coil being adapted for generating a second magnetic field component Bx in the second direction X at said predefined location;

a fourth coil Cy1 and a fifth coil Cy2 arranged on opposite sides of the cavity q1, the fourth and fifth coil having a common axis (Y) oriented in a third direction perpendicular to the first direction Z and perpendicular to the second direction X, the fourth and fifth coil being adapted for generating a third magnetic field component By in the third direction Y at said predefined location.

As far as is known to the inventors, such a structure does not yet exist in the prior art.

Although in hind-sight, the idea of "providing three coils (or coil pairs) having respective axes that intersect at a test location where a device under test is located" may seem rather simple, it was believed for many years to be impossible to build a structure capable of providing a sufficiently large and homogeneous field, that also had a sufficiently large opening for allowing a packaged device under test to be brought towards and to be removed from the test location. It was only after the inventors came to the idea of using a solenoid for one of the coil pairs, that it became realistic and practically feasible to build such a structure. This is one of the underlying concepts of the present invention.

Referring now to the Figures.

FIG. 1 shows an exemplary chip-package, for example a plastic or ceramic package comprising a semiconductor device connected to a lead frame, and shows three orthogonal axes X, Y, Z typically associated with such a package: an X-axis showing a longitudinal direction, a Y-axis showing a transverse direction, and a Z-axis showing a direction perpendicular to the plane of the semiconductor device. The X- and Y-axis are also referred to as "in-plane" axes. The Z-axis is also referred to as "out-of-plane" axis.

In order to functionally test such an Integrated Circuit (IC), also referred to as "chip", the chip is placed typically in a controlled environment with a known magnetic field and a known temperature, and electrical contact is made with the pins 102 for example to apply power and/or to read-out a signal measured by the chip, and/or one or more signals derived therefrom, for example a linear or angular position value.

Figure 2:
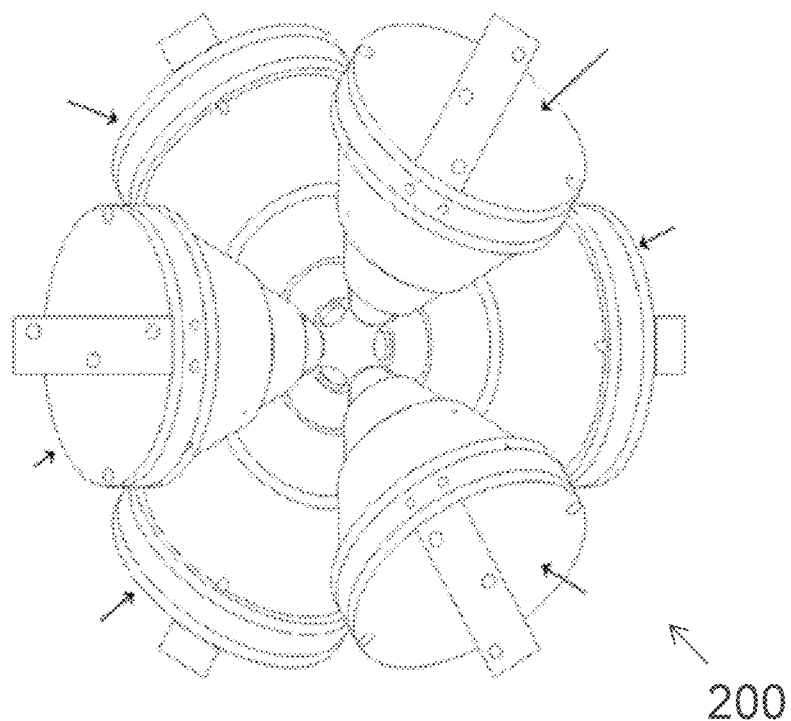
FIG. 2 is a replica of FIG. 3b of US20120229129A1, described in the background section.

FIG. 2 is a replica of FIG. 3b of US20120229129A1, which describes a probing station 200 with magnetic measurement capabilities for testing wafers before dicing, by making use of probes brought into contact with the wafer surface. While the inventors of the probing station were faced with similar problems of accuracy, physical accessibility of the test location, sufficiently large field strength, homogeneity of the magnetic field, etc., a completely different solution is proposed, as will become clear further.

Figure 3:
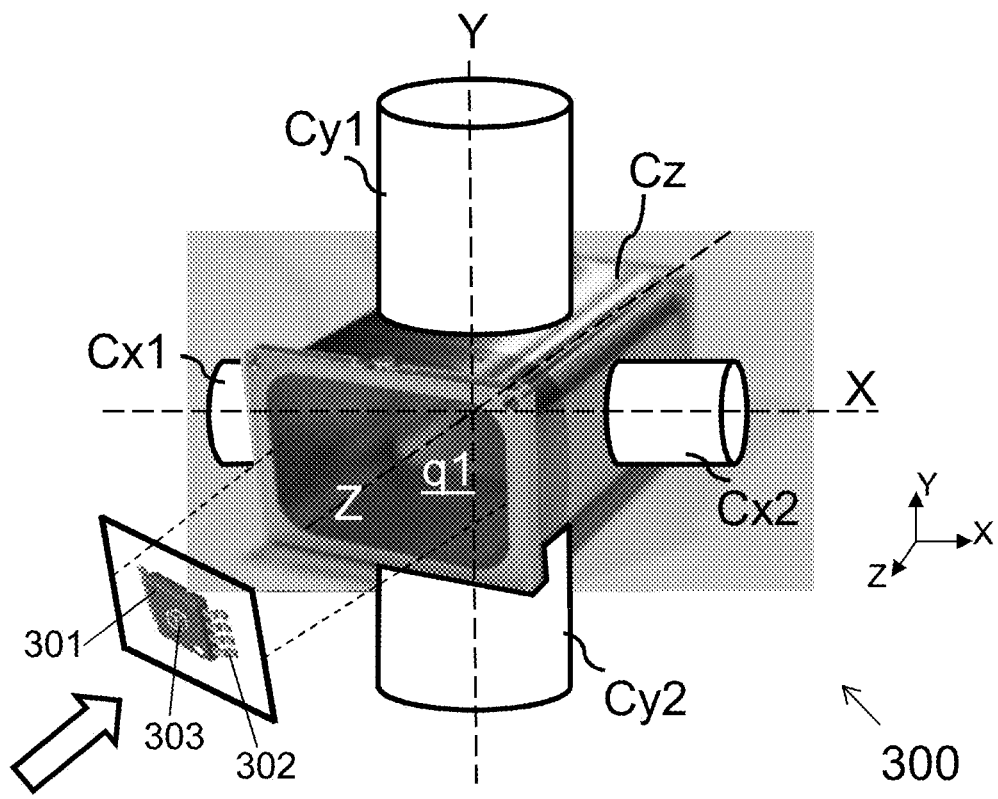
FIG. 3 is a schematic drawing showing an exemplary coil arrangement according to an embodiment of the present invention, comprising a solenoid (also referred to herein as the "Z-coil") forming a cavity for accommodating a packaged IC to be tested, and two pairs of electromagnets (so called "X-coils" and "Y-coils" arranged on opposite sides of the solenoid. The coils define an orthogonal set of axes X, Y, Z.

FIG. 3 is a schematic drawing showing an exemplary coil arrangement 300 according to an embodiment of the present invention. The coil arrangement 300 comprises a solenoid Cz (also referred to herein as the "Z-coil") forming a cavity q1 having a size and shape for allowing a packaged IC to be tested to be positioned therein, and further comprises two pairs of coils Cx1, Cx2 (also referred to herein as the "X-coils") and Cy1, Cy2 (also referred to herein as the "Y-coils") arranged outside and on opposite sides of the solenoid Cz.

As can be appreciated by a person skilled in the art, the solenoid Cz generates a magnetic field which is substantially homogeneous inside the solenoid Cz, especially near the centre of the cavity, and which has flux lines (not shown in FIG. 3, but see for example FIG. 16c and FIG. 16d) which are oriented substantially parallel to the Z-axis. The pair of X-coils Cx1 and Cx2 generates a magnetic field which is superimposed with the magnetic field generated by the solenoid Cz, and which has flux lines (not shown in FIG. 3, but see for example FIG. 16(a)) which are oriented substantially parallel to the X-axis, especially near the centre of the cavity. The pair of Y-coils Cy1 and Cy2 generates a magnetic field which is superimposed with the magnetic field generated by the solenoid Cz and the magnetic field generated by the pair of X-coils, and which has flux lines (not shown in FIG. 3, but see for example FIG. 16(b)) which are oriented substantially parallel to the Y-axis, especially near the centre of the cavity.

The coils Cz, Cx1, Cx2, Cy1, Cy2 define an orthogonal set of axes X, Y, Z. This offers the advantage that the total magnetic field at the centre of the cavity q1 can be represented by a vector (Bx, By, Bz) where the Bx component is primarily or solely dependent on the field created by the X-coils, and is not significantly or only marginally or not at all dependent on the current flowing through the Y-coils and through the Z-coil. Likewise, the By component is primarily or solely dependent on the field created by the Y-coils, thus on the current flowing through the Y-coils, and the Bz component is primarily or solely dependent on the field created by the Z-coil, thus on the current flowing through the solenoid. It is an advantage that there is no significant or no cross-talk between the coils.

FIG. 3 also shows (bottom left) a schematic representation of a chip positioner or handler or gripping device having a movable arm or the like for inserting and/or removing a chip 301 into/from the solenoid. The exact details of the gripping device or handler are not the main focus of the present invention, and any suitable gripping device may be used.

In preferred embodiments, the coil arrangement 300 does not comprise ferromagnetic materials (such as iron or Nickel), but may comprise non-ferro-magnetic materials (such as Copper or Aluminum). This offers the advantage that the magnetic field generated by the currents has no significant hysteresis or no hysteresis at all. Ideally, the magnetic field components Bx, By, Bz generated at the test site inside the cavity q1 are linearly dependent on the currents flowing through the coils. In practice this means that also other objects in the vicinity of the coil arrangement 300 do not comprise ferromagnetic materials, as will be discussed further (see for example FIG. 13).

Figure 15A:
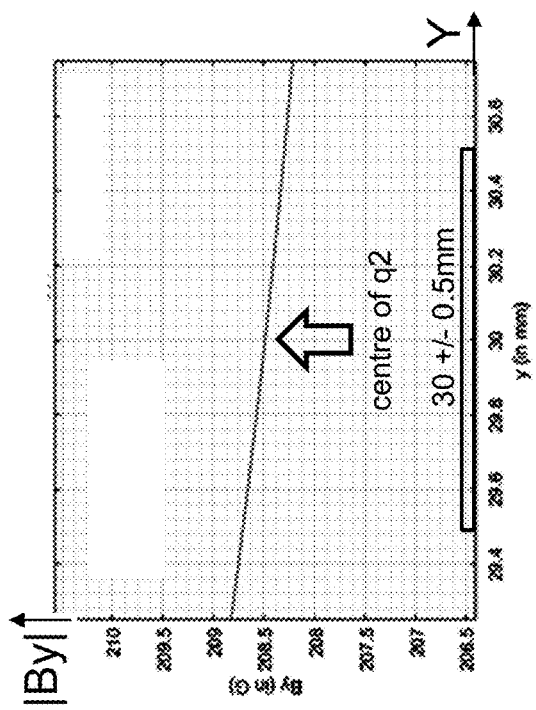
FIG. 15(a) shows plots of the magnitude of the magnetic field component By at various positions along the Y-axis, if the outer Y-coils and the intermediate Y-coil carry the same current.
Figure 15B:
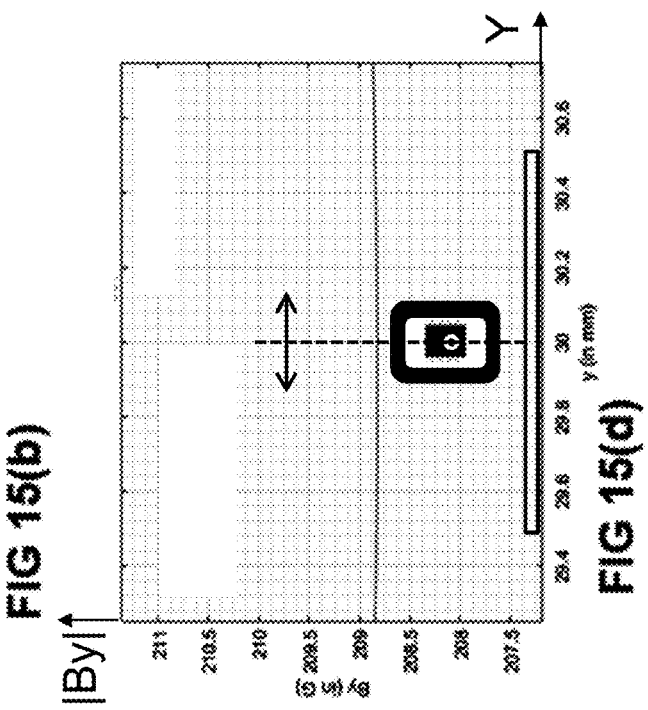
FIG. 15(b) shows an enlarged portion of the magnetic field component By at the test-location(s) (where the device is/are to be positioned during testing), showing a non-homogeneous field at the test-location, but a field having a non-zero dBy/dy field gradient.
Figure 15C:
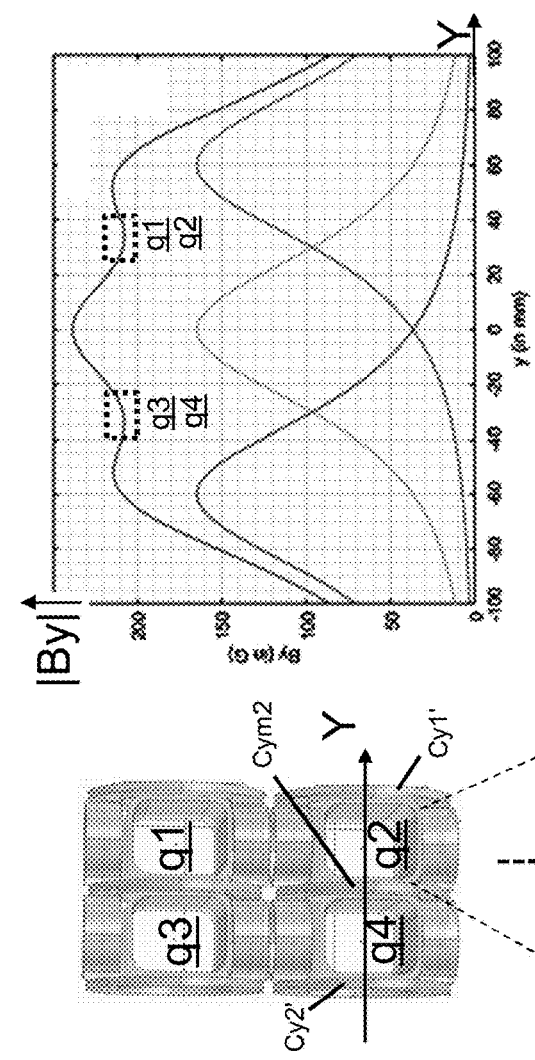
FIG. 15(c) shows plots of the magnitude of the magnetic field component By at various positions along the Y-axis, if the intermediate Y-coil carries a smaller current than the outer Y-coils (e.g. in the range from about 70% to about 95% thereof), as is used in some embodiments of the present invention.
Figure 15D:
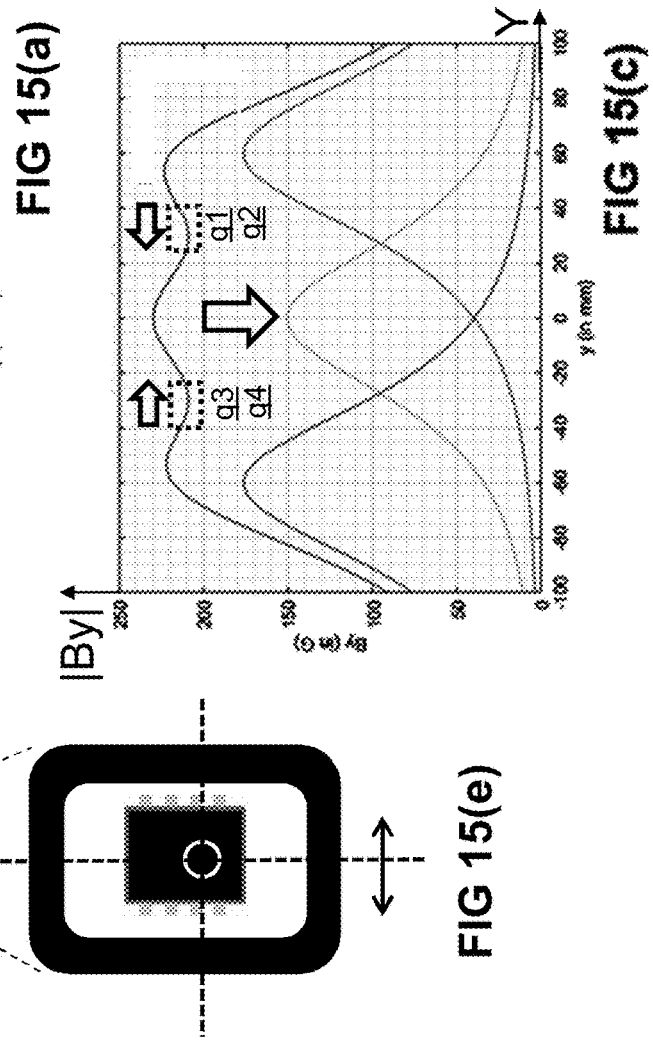
FIG. 15(d) shows an enlarged portion of the magnetic field component By at the test-location (where the device is to be positioned during testing), showing a highly homogeneous field having a reduced or substantially zero dBy/dy field gradient.
Figure 15E:
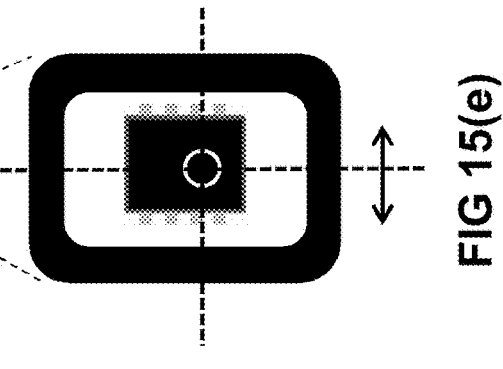
FIG. 15(e) illustrates how a more homogeneous By field-component can be generated at the test locations inside the cavities of the coil arrangement of FIG. 10.

In preferred embodiments, the Z-coil Cz has a tubular shape with a cross section having an inner perimeter and an outer perimeter (better shown in FIG. 14e and FIG. 15e). The inner perimeter may be substantially rectangular, e.g. rectangular with rounded corners or with truncated corners, or substantially elliptical. Preferably the inner perimeter is large enough to accommodate the packaged IC to be tested, oriented such that its out-of-plane (Z)-axis is parallel to the (Z)-axis of the solenoid. This offers the advantage that the packaged chip can be selectively introduced into and removed from the solenoid via a first opening at one end of the solenoid (which remains open), and that the other end of the solenoid can be provided with contact needles and/or cables or the like for making electrical contact with the pins of the chip for testing the chip.

In a variant of the coil arrangement shown in FIG. 3, the X-axis defined by the X-coils Cx1, Cx2 and the Y-axis defined by the Y-coils Cy1, Cy2 are located in a plane perpendicular to the Z-axis defined by the Z-coil or solenoid Cz, but the X-axis and Y-axis may not be exactly perpendicular to each other, but form an angle in the range from 45° to 88° or from 92° to 135°, or from 80° to 88° or from 92° to 100°. While such a coil arrangement is somewhat less ideal, and the formulas to determine the currents to be applied for obtaining a particular magnetic field (or vice versa) may be somewhat more complex, such embodiments will also work.

Figure 4:
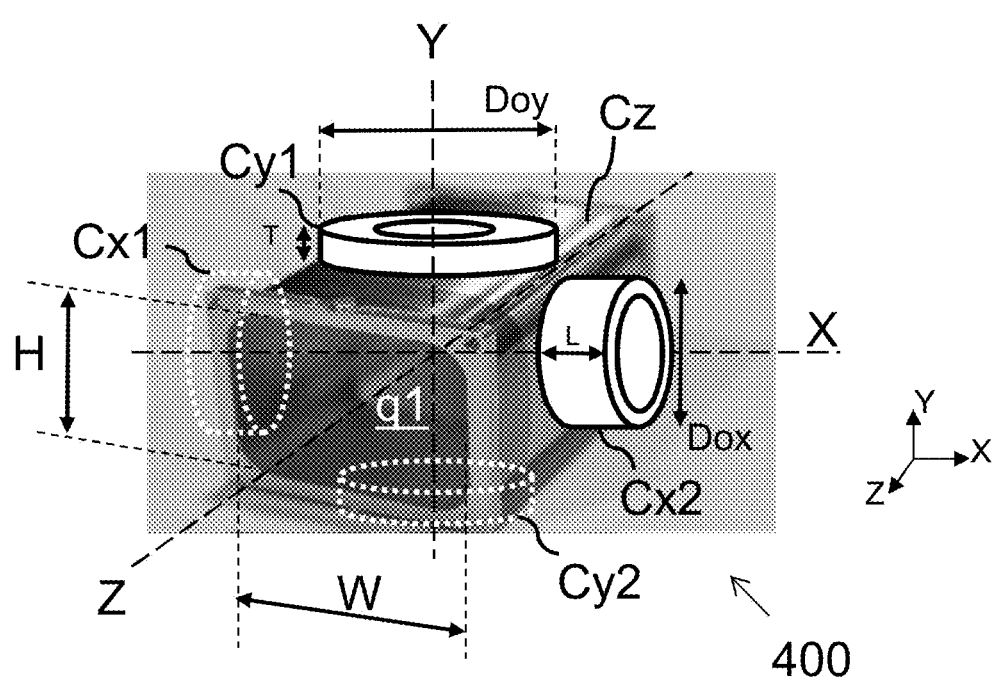
FIG. 4 is another exemplary coil arrangement according to an embodiment of the present invention, which can be seen as a more compact variant of the coil arrangement of FIG. 3.

FIG. 4 shows another exemplary coil arrangement 400 according to an embodiment of the present invention, which can be seen as a more compact variant of the coil arrangement 300 of FIG. 3. In the example of FIG. 4, the solenoid Cz has a tubular shape with a substantially rectangular cross section defining an inner height H (also referred to herein as "minor axis") and an inner width W (also referred to as "major axis"), wherein the ratio H/W is a value in the range from 30% to 80%.

Each of the second, third, fourth and fifth coil Cx1, Cx2, Cy1, Cy2 has a cylindrical shape or a ring shape with a circular cross section. Each of the second and third coil Cx1, Cx2 located adjacent the wall sections defining the height of the solenoid (extending in the direction of the minor axis), has a cylindrical shape with an outer diameter Dox, and a length L, wherein the ratio L/Dox is typically a value in range from 50% to 80%. And each of the fourth and fifth coil Cy1, Cy2 located adjacent the wall sections defining the width W of the solenoid (extending in the direction of the major axis), has a ring shape with an outer diameter Doy and a thickness T, wherein the ratio T/Doy is typically a value in the range from 5% to 25%

Figure 5:
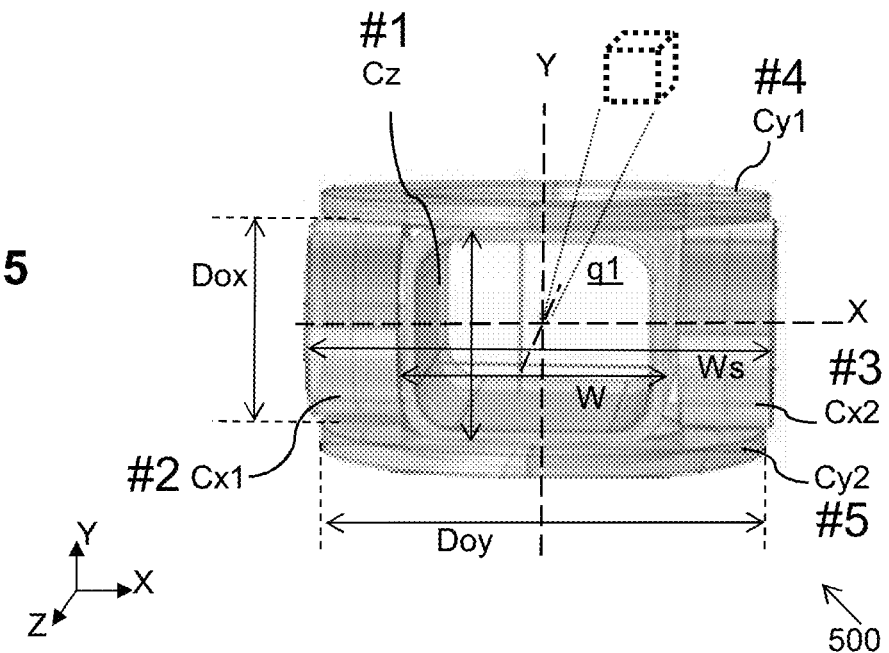
FIG. 5 is another exemplary coil arrangement according to an embodiment of the present invention, having two cylindrical X-coils (left, right), and two ring shaped Y-coils (top, bottom), the Y-coils extending over the width of the assembly.

FIG. 5 shows another exemplary coil arrangement 500 according to an embodiment of the present invention, having two cylindrical X-coils (left, right), and two ring shaped Y-coils (top, bottom). In this embodiment, the Y-coils extend over the entire width of the assembly, and the X-coils and the Z-coil are sandwiched between the Y-coils. As can be appreciated from the drawing, this is a highly symmetrical and compact structure, which is capable of generating a magnetic field with a configurable, magnetic field vector (Bx, By, Bz) at the envisioned test-location, indicated by a dotted cube of about 0.50 mm×0.50 mm×0.50 mm or about 1.00 mm×1.00 mm×1.00 mm. Inside that imaginary cube, the magnetic field is fairly constant or substantially homogeneous, as will be explained further (see FIG. 14d and FIG. 15d).

It is an advantage of this embodiment that the outer diameter Doy of the Y-coils is larger than the width W of the solenoid, because this further improves the homogeneity of the By-field component (e.g. reduces dBy/dx and dBy/dz).

Figure 6:
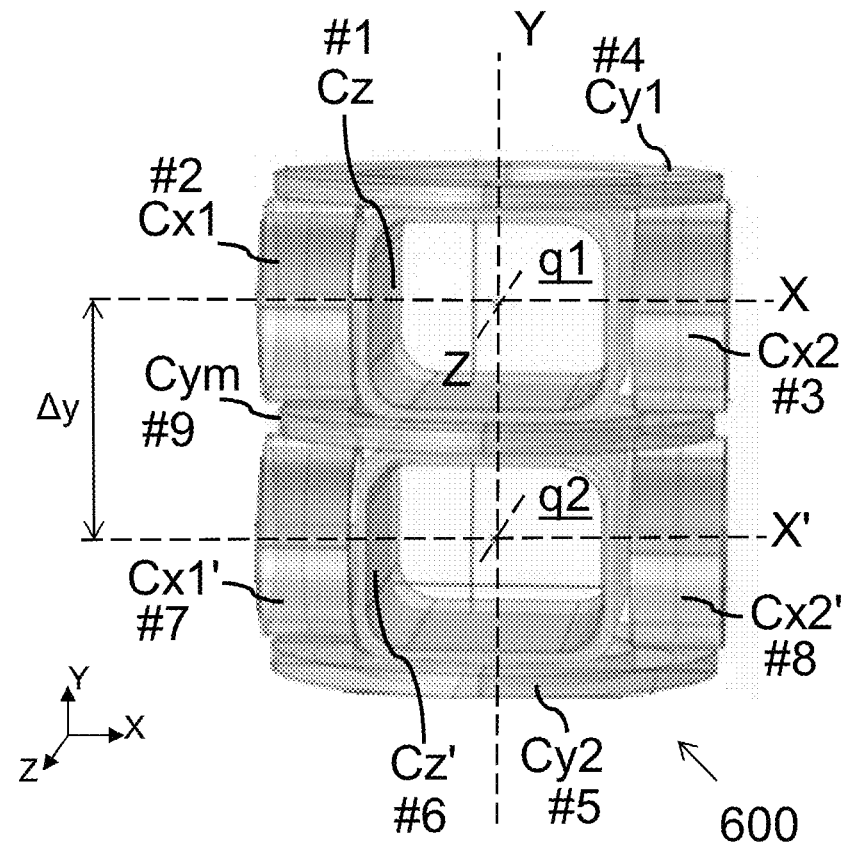
FIG. 6 is another exemplary coil arrangement according to an embodiment of the present invention, having two Z-coils in the form of two parallel solenoids forming two cavities (which in FIG. 6 are arranged on top of each other), and two pairs of cylindrical X-coils (left, right), and two outer, ring shaped Y-coils (top, bottom), and one intermediate ring-shaped Y-coil, hence in total 9 coils.

FIG. 6 is another exemplary coil arrangement 600 according to an embodiment of the present invention, having two Z-coils Cz, Cz' in the form of two parallel solenoids forming two cavities q1, q2, which in FIG. 6 are located on top of each other (in the Y-direction, in the direction of the minor axis), and two pairs of cylindrical X-coils Cx1, Cx2 and Cx1', Cx2' (left, right), and two outer, ring shaped Y-coils Cy1, Cy2 (top, bottom), and one intermediate, ring-shaped Y-coil Cym, hence in total 9 coils.

Comparing FIG. 5 and FIG. 6, it may seem that the coil arrangement 600 of FIG. 6 is simply a stack of two coil arrangements 500 shown in FIG. 5, and such an arrangement with 10 coils would indeed also work, but the coil arrangement 600 is further optimized (in terms of component count) in that it has only one intermediate Y-coil Cym.

The coil arrangement 600 of FIG. 6 has all the advantages of the coil arrangements 300 and 400 and 500 described above, e.g. allows to generate a configurable and highly accurate and highly homogeneous 3D magnetic field vector Bx, By, Bz, moreover at two test-locations simultaneously, allowing two packaged devices to be tested simultaneously.

Figure 16A:
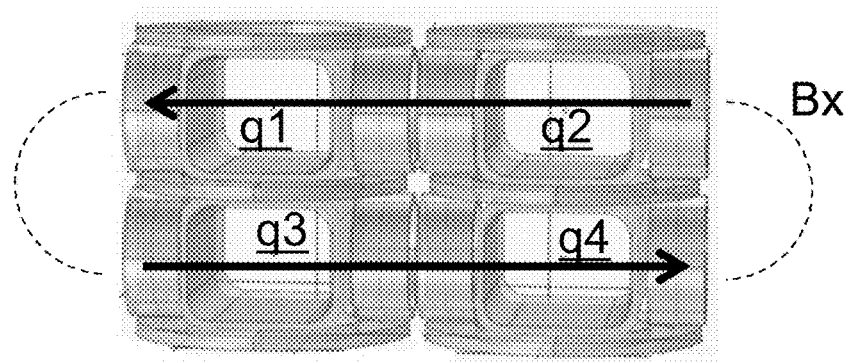
FIG. 16(a) illustrates easy looping of the field lines generated by the X-coils.
Figure 16B:
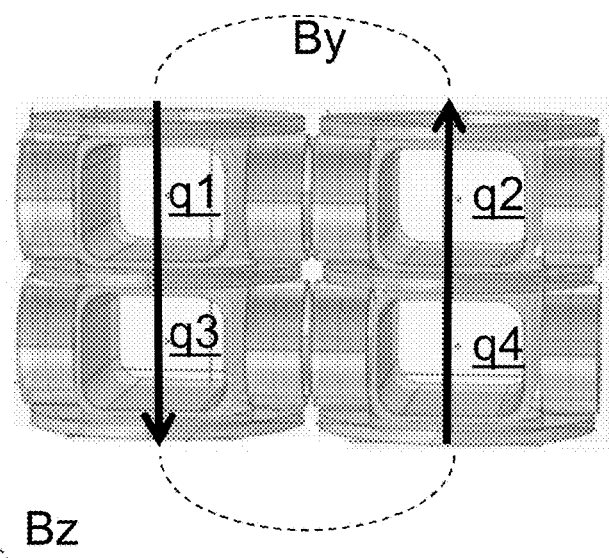
FIG. 16(b) illustrates easy looping of the field lines generated by the Y-coils.

The inventors however surprisingly found that this structure allows two further advantages when particular currents are applied, as will be described in more detail further (FIG. 15 and FIG. 16b). Thus, the coil arrangement 600 of FIG. 6 should not be seen as a mere geometrical variant of the coil arrangement 500 shown in FIG. 5.

Figure 7:
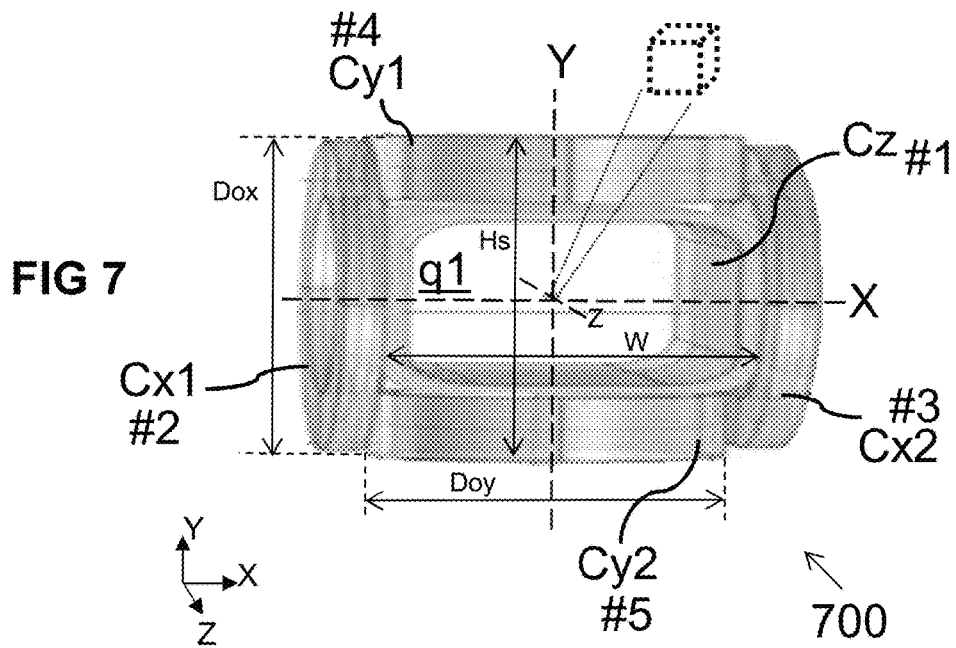
FIG. 7 is another exemplary coil arrangement according to an embodiment of the present invention, having cylindrical (e.g. ring shaped) X-coils (left, right), and cylindrical (e.g. ring-shaped) Y-coils (top, bottom).

FIG. 7 shows another exemplary coil arrangement 700 according to an embodiment of the present invention, having cylindrical (e.g. ring shaped) X-coils Cx1, Cx2 (left, right), and cylindrical (e.g. ring-shaped) Y-coils (top, bottom) Cy1, Cy2.

The coil arrangement 700 of FIG. 7 can be seen as a geometrical variant of the coil arrangement 500 of FIG. 5. The main difference being that in the embodiment of FIG. 7, the Y-coils Cy1, Cy2, which are located adjacent the larger wall sections of the solenoid (top and bottom in FIG. 7), and the Z-coil Cz are sandwiched between the X-coils Cx1, Cx2 which are located adjacent the shorter (upright) wall sections of the solenoid (left and right in FIG. 7). The outer diameter Dox of the X-coils extends over the total height Hs of the stack comprising the Cy1, Cz and Cy2 coil. The outer diameter Doy of the Y-coils spans the distance between the two X-coils.

The coil arrangement 700 is also a highly symmetrical and compact structure, capable of generating a magnetic field with a configurable, magnetic field vector (Bx, By, Bz) at the envisioned test-location, indicated by a dotted cube of about 0.50 mm×0.50 mm×0.50 mm or about 1.00 mm×1.00 mm×1.00 mm, which is where the magnetic sensitive area of the packaged chip is to be positioned.

It is an advantage of this embodiment that the outer diameter Dox of the X-coils is larger than the height H (minor axis) of the solenoid Cz, because this further improves the homogeneity of the Bx-field component (e.g. reduces dBx/dy and dBx/dz).

The coil arrangement 500 of FIG. 5 or the coil arrangement of FIG. 7 are both highly compact, and depending on the boundary conditions, e.g. maximum outer dimensions of the coil arrangement and/or given dimensions of the cavity, and/or required magnetic field strength, and/or required accuracy, one of these arrangements may be slightly better than the other.

Figure 8:
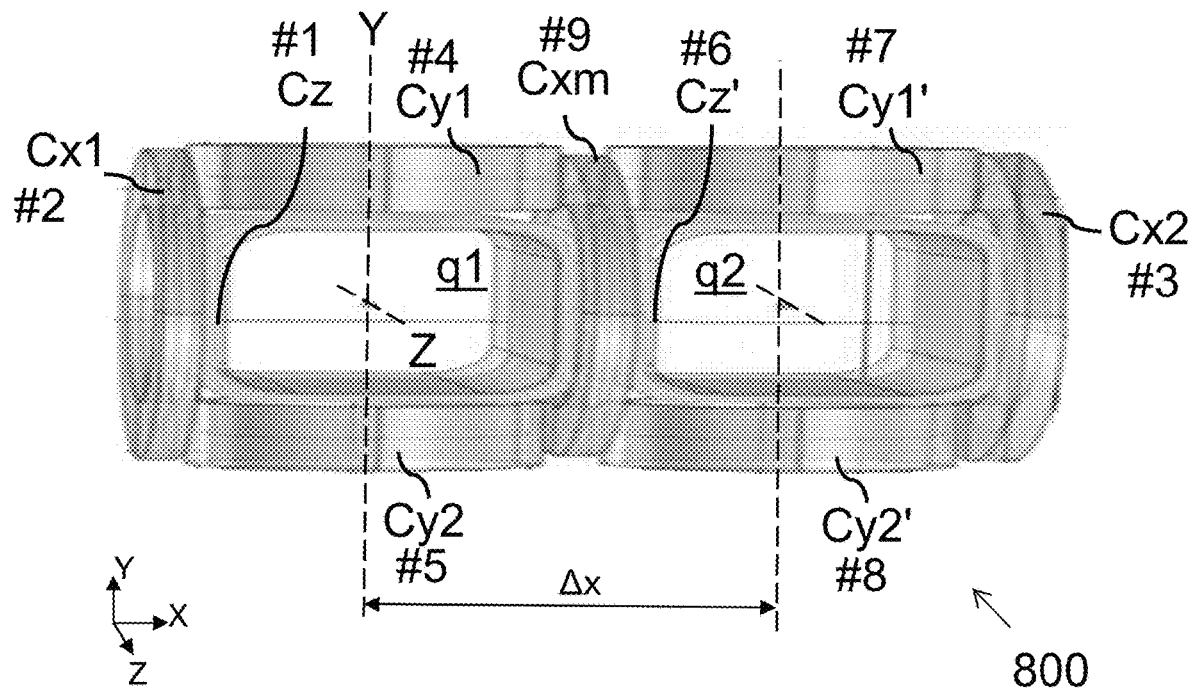
FIG. 8 is another exemplary coil arrangement according to an embodiment of the present invention, having two Z-coils in the form of two parallel solenoids forming two cavities arranged side-by-side, and two pairs of cylindrical (e.g. ring shaped) Y-coils (top, bottom), and two outer cylindrical (e.g. ring shaped) X-coils (left, right), and one intermediate cylindrical (e.g. ring-shaped) X-coil, hence in total 9 coils.

FIG. 8 is another exemplary coil arrangement 800 according to an embodiment of the present invention, having two Z-coils Cz, Cz' in the form of two parallel solenoids forming two cavities q1, q2, which in FIG. 8 are arranged side-by-side (in the X-direction, in the direction of the major axis), and two pairs of cylindrical X-coils Cx1, Cx2 (left, right), and two outer, ring shaped Y-coils Cy1, Cy2, Cy1', Cy2' (top, bottom), and one intermediate, ring-shaped X-coil Cxm, hence in total 9 coils.

Comparing FIG. 8 and FIG. 7, it may seem that the coil arrangement 800 of FIG. 8 is simply a combination of two coil arrangements 700 shown in FIG. 7, and such a combination with 10 coils would indeed also work, but the coil arrangement 800 is further optimized (in terms of component count) in that it has only one intermediate X-coil Cxm.

In fact, simulations have shown that an arrangement with two intermediate X-coils (not shown in FIG. 8, but see for example the upper and lower portion of FIG. 10) may actually be better (in terms of electrical power required to obtain a certain magnetic field strength, and homogeneity obtained at the test sites) as the distance ΔX increases.

While not mentioned above, the same is true for the intermediate Y-coil of FIG. 6. If the distance ΔY increases, it may be advantageous (in terms of electrical power required to obtain a certain magnetic field strength, and homogeneity obtained at the test sites), to provide two intermediate Cy coils instead of only one.

Referring back to FIG. 8, the coil arrangement 800 offers the same advantages as the coil arrangements described above, e.g. allows to generate a configurable and highly accurate and highly homogeneous 3D magnetic field vector Bx, By, Bz, at two test-locations simultaneously, allowing two packaged devices to be tested simultaneously. And similar to the coil arrangement 600 of FIG. 6, the structure of FIG. 8 also provides further advantages when particular currents are applied, as will be described in more detail further (FIG. 15 and FIG. 16b).

Figure 9:
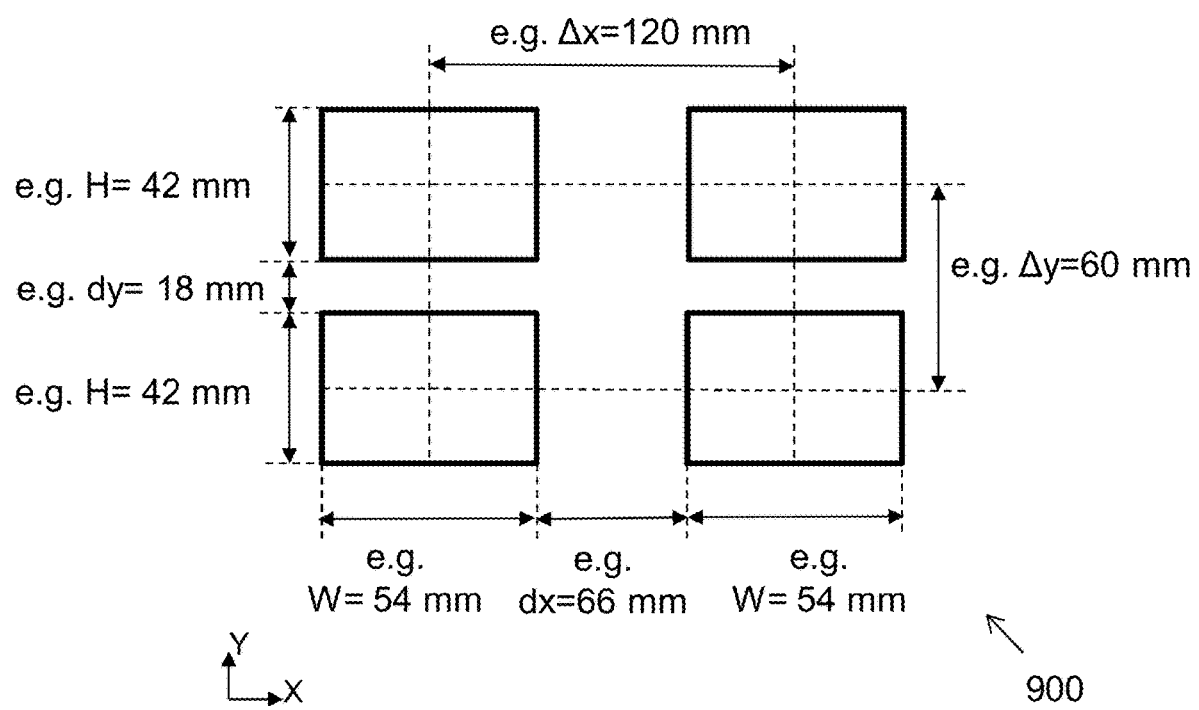
FIG. 9 shows some boundary conditions for a preferred embodiment of the present invention. More specifically.

FIG. 9 shows a set of specific boundary conditions applicable for a preferred embodiment of the present invention. More specifically, FIG. 9 shows the dimensions and relative positions of four "access windows" for allowing an existing "device positioner" (not shown) to simultaneously insert or retract four chip packages into or from four test locations.

In the specific example shown, the test structure needs to provide four cavities having a cross section of at least 54 mm by 42 mm, and having centres spaced apart by 60 mm in the Y-direction, and 120 mm in the X-direction.

Figure 10:
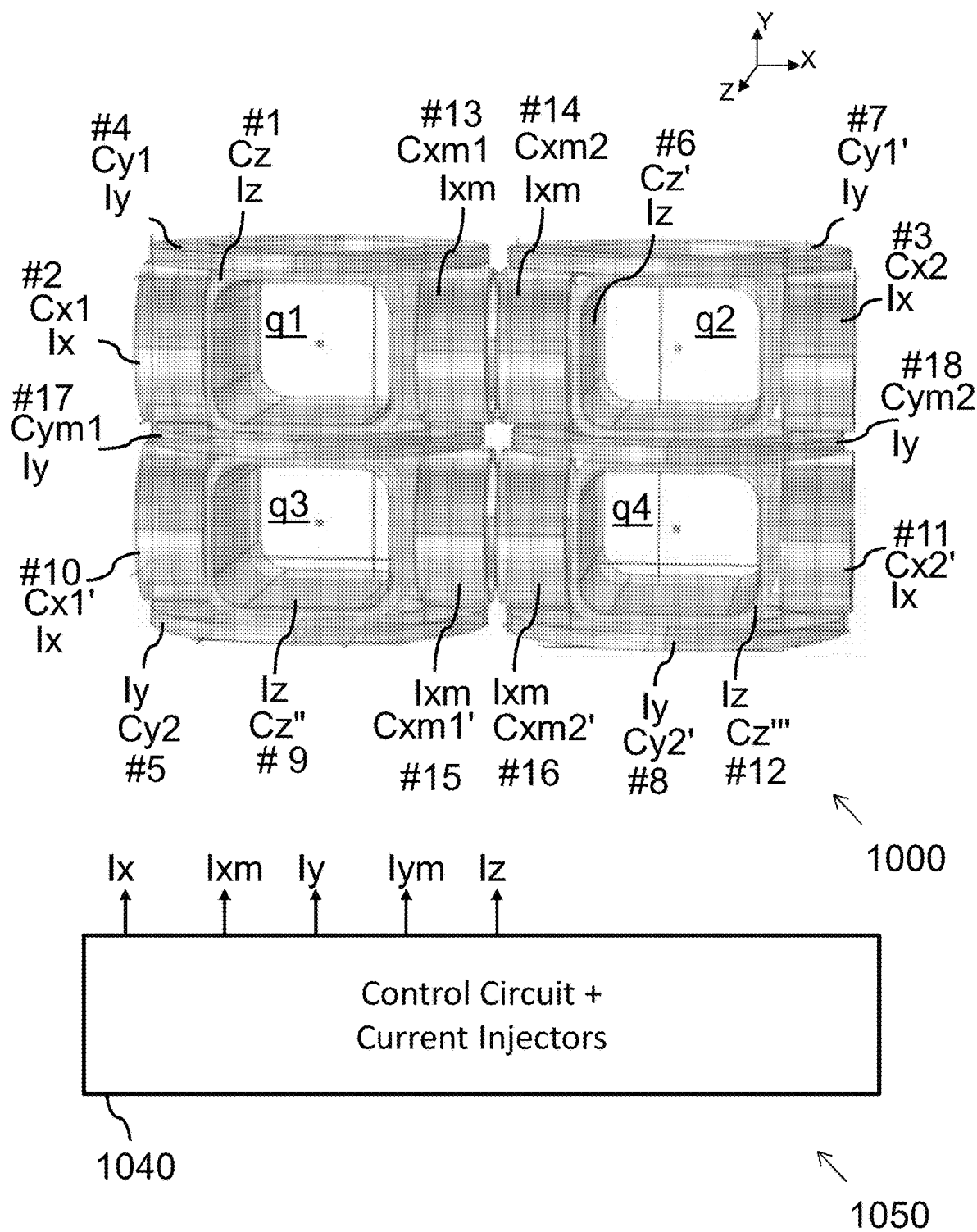
FIG. 10 (top) shows another exemplary coil arrangement according to an embodiment of the present invention, having four Z-coils in the form of four parallel solenoids forming four cavities, and two pairs of outer X-coils (left, right), and four intermediate X-coils, and two pairs of outer Y-coils (top, bottom), and two intermediate Y-coils, hence in total 18 coils.

FIG. 10 (top) shows a coil arrangement 1000 according to another embodiment of the present invention, having:
 four Z-coils Cz, Cz', Cz'', Cz''' in the form of four parallel solenoids forming four cavities q1-q4, and
 two pairs of outer X-coils Cx1, Cx2 and Cx1', Cx2' (left, right in FIG. 10), and
 four intermediate X-coils Cxm1, Cxm2, Cxm1', Cxm2', and
 two pairs of outer Y-coils Cy1, Cy2 and Cy1', Cy2' (top, bottom), and
 two intermediate Y-coils Cym1, Cym2,
hence 18 coils in total.

The number and dimensions and relative positions of the coils of this arrangement were chosen to fit the requirements shown in FIG. 9. For a relatively low field strength (e.g. about 2 mT in each direction), and constrained by these outer dimensions, it is then possible to find a suitable combination of wire gage and number of turns that would provide a maximum magnetic field strength for a given current, without having to take into account power dissipation. FIGS. 17(a) to 17(e) shows that only five different types of coils need to be dimensioned. It is noted that, if power dissipation were not a constraint, one could choose the smallest possible or available wire gage in order to increase the number of turns (B ~N.I) and maximize the mean diameter of the coil and reduce the thickness of the coil (i.e. outer diameter minus inner diameter). This would increase the magnitude of the magnetic field and increase the homogeneity of the field.

But the inventors found that, in order to create a magnetic field strength in the order of about 20 mT, power dissipation needs to be taken into account as another boundary condition. Stated in simple terms, for a given maximum allowed power dissipation (e.g. 100 Watt) and a given required field strength (e.g. 20 mT), and taking into account the geometrical constraints, the inventors had to find a suitable cross section of the wires that satisfies the requirements. The skilled reader will appreciate that it was impossible to predict the ultimate length and inner diameter of the coils, let alone to have any idea about the homogeneity of the resulting magnetic field vectors.

In preferred embodiments, the wires of the coils have a square or rectangular cross section, in order to minimize the electrical resistance of the wires for a given coil cross section.

FIG. 10 (bottom) also shows an electrical unit 1040 configured for providing currents Ix, Ixm, Iy, Iym, Iz to the coils of the coil arrangement 1000. Together, the coil arrangement 1000 and the electrical unit 1040 form a test system 1050.

Circuitry for allowing or forcing currents to flow in coils are well known in the art (for example in the art of power supplies, or in the art of BLDC motors), and therefore need not be explained in detail herein.

In one embodiment (interconnection scheme #1), each of the 18 coils of the coil arrangement 10 is connected with the control unit via 2 wires, requiring 18×2=36 conducting wires in total between the electrical unit 1040 and the coil arrangement 1000.

In another embodiment (interconnection scheme #2), all outer X-coils Cx1, Cx2, Cx1' and Cx2' are connected in series, and provided with a first current Ix; and all outer Y-coils Cy1, Cy2, Cy1' and Cy2' are connected in series, and provided with a second current Iy; and all intermediate X-coils Cxm1, Cxm2, Cxm1' and Cmx2' are connected in series, and provided with a third current Ixm; and all intermediate Y-coils Cym1, Cym2 are connected in series, and provided with a fourth current Iym; and all Z-coils Cz, Cz', Cz", Cz''' are connected in series, and provided with a fifth current Iz, requiring only 5×2=10 conducting wires in total between the electrical unit 1040 and the coil arrangement 1000.

The intermediate X-coils are preferably not connected in series with the outer X-coils, and the intermediate Y-coils are preferably not connected in series with the outer Y-coils, as will become clear when discussing FIG. 14 and FIG. 15.

But of course, the present invention is not limited to these two interconnection schemes, and other interconnection schemes are also contemplated.

FIG. 11(a) shows a set of formulas that may be used by the electrical unit 1040 of FIG. 10 for determining the currents Ix, Iy, Iz, Ixm, Iym to be applied to the coils when using the second interconnection scheme) in order to generate a magnetic field having field components (Bx, By, Bz) at the test locations (see e.g. the dotted cube of FIG. 5 and FIG. 7), where the magnetic sensor element(s) of the packages devices are to be positioned during testing.

As can be seen in FIG. 11(a), each of the currents Ix, Iy and Iz can be expressed as a linear combination of the desired field vectors Bx, By, Bz. The values αx, αy, αz, βx, βy, βz, γx, γy, γz, and εx, εy, εz are constants which can be determined by design or simulation or during a calibration test, and can for example be stored in a non-volatile memory of the electrical unit 1040.

The current Ixm is proportional to the current Ix, using a constant Kx, and the current Iym is proportional to the current Iy using a constant Ky. The value of Kx and Ky are constants which can be determined during a calibration test. As can be seen, these formulas allow to take into account some amount of cross-talk between the different coils.

FIG. 11(b) shows a set of formulas (6) to (9) that may be used by the electrical unit 1040 of FIG. 10 for determining which magnetic field components (Bx, By, Bz) are generated inside the cavities when a given set of currents Ix, Iy, Iz, Ixm, Iym is applied to the coils, where Ix, Iy and Iz can be chosen independently, but the value of Ixm and Iym are determined by formula (4) and (5), (where "csi" stands for "contact site number" or simply "test location", and should be interpreted as an index, not as a power). The values of kxx, kxy, kxz, koffx, kyx, kyy, kyz, koffy, kzx, kzy, kzz, koffz are constants which can be determined during a calibration test, and can for example be stored in a non-volatile memory of the electrical unit 1040.

FIG. 11(c) shows an exemplary set of coefficients applicable to the first test site (csi=1) of a prototype device, as an example only, but of course the invention is not limited to this particular set of coefficients. As can be seen, the values of the coefficients kxx, kyy and kzz are relatively large (in the example about 2.44, 2.24 and 7.01 respectively), while the other coefficients are relatively low (in the example ranging from about 4E-05 to about 7E-02 in absolute value, which is more than one order of magnitude smaller). These values can be predetermined (e.g. via simulation) or determined or adjusted via a calibration process, e.g. using a magnetometer. The coefficients may vary for each of the test locations.

In order to increase the signal-to-noise ratio (SNR) of the test-system, the inventors wanted to further increase the maximum magnetic field strength. The classical approach to address this problem is to add ferromagnetic material, but that would create hysteresis, and ruin the linearity of the system.

The inventors therefore took a radically different approach, and came to the idea of actively cooling the coils by means of a liquid, but of course the liquid should be prevented from entering the cavities q1 to q4. It is noted that the device is to be used in a production environment, not in a scientific lab, hence cooling of coils is certainly not a trivial choice.

Figure 12:
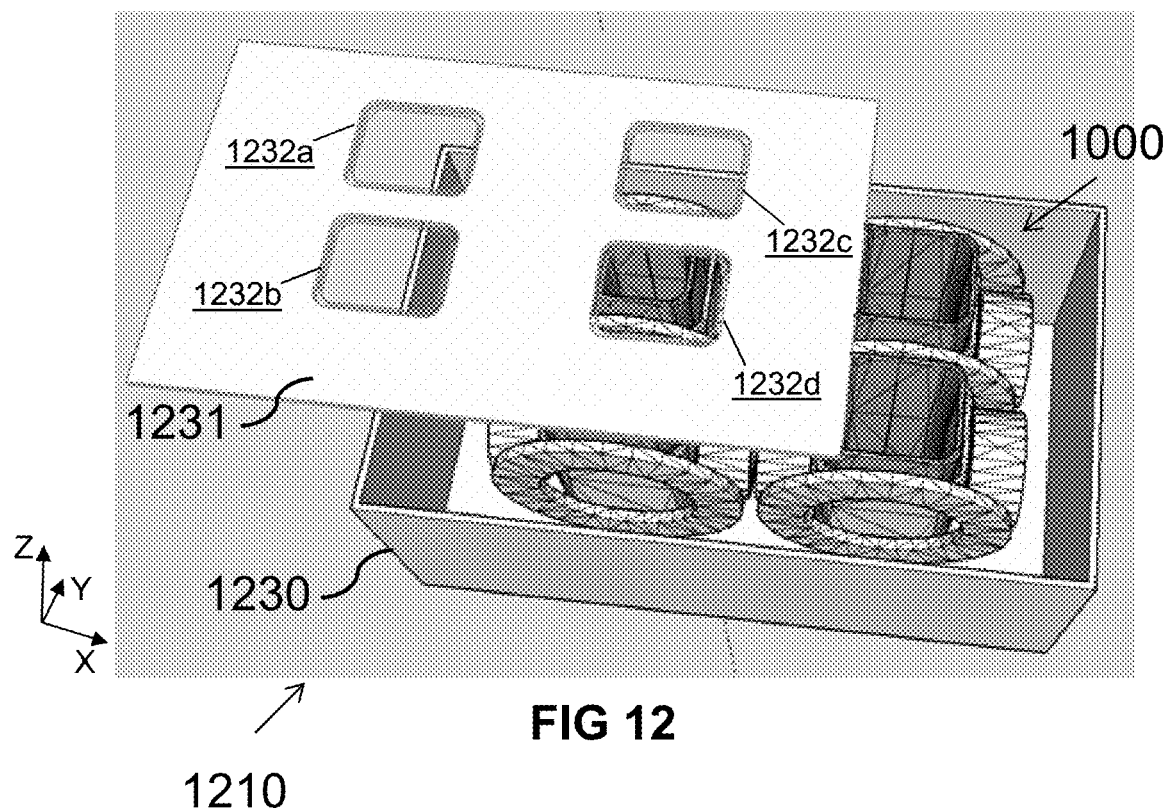
FIG. 12 shows an exemplary test arrangement according to an embodiment of the present invention, comprising the coil arrangement of FIG. 10 arranged in a container, the container adapted for holding a liquid, where the liquid is electrically isolated from, but in thermal contact with the coils of the coil arrangement.

FIG. 12 shows an exemplary test arrangement 1210 according to an embodiment of the present invention, comprising the coil arrangement 1000 of FIG. 10 arranged in a container 1230, the container is adapted for holding a liquid, for example water or an oil. Suitable cooling liquids are known in the art, and are commercially available. In principle any cooling liquid which is not electrically conductive, and/or not corrosive (to the container), and/or not contaminating for the environment, can be used.

The container preferably has a bottom with four apertures for providing access to the cavities (not very well visible in FIG. 12, but located at the bottom of FIG. 12), and preferably also has a removable lid 1231 with four corresponding apertures 1232a-1232d for providing access to the opposite end of the cavities of the coil arrangement 1000. The length of the solenoids may be somewhat larger than the outer diameter of the Y-coils to facilitate a liquid-tight sealing with the apertures in the bottom and in the lid. Suitable sealing means are known in the art, and may for example be based on rubber or other plastic or elastic materials.

In preferred embodiments, the container 1230 has a length (in the X-direction) in the range from about 40 to about 50 cm, and a height (in the Z-direction) of about 20 to about 30 cm, and a width (in the Y-direction) of about 10 to about 15 cm, which is very compact. In an exemplary embodiment the dimensions are: L=46.0 cm, H=24.2 cm, W=11.5 cm, but of course the present invention is not limited to this particular example.

The electrical wires of the coil arrangement 10 are provided with an electrical isolation surrounding the conducting wires of the coils, but the thermal resistance of the electrical isolation should be sufficiently low to allow sufficient cooling of the coils when conducting a relatively high current, for example a current with an amplitude of at most 1.0 Amps (in case no liquid cooling is used), or for example a current with an amplitude of at most 10.0 Amps (in case liquid cooling is used).

Optionally the container may further comprise one or more stirring devices for stirring the liquid in the vicinity of the coils, for improving the heat transfer, but other means for improving the heat transfer may also be used. The liquid inside the container 1230 can be cooled in any suitable way, for example by cooling the wall sections of the container 1230, but other ways are also possible, for example by adding one or more heat exchangers inside the container, etc.

Figure 13:
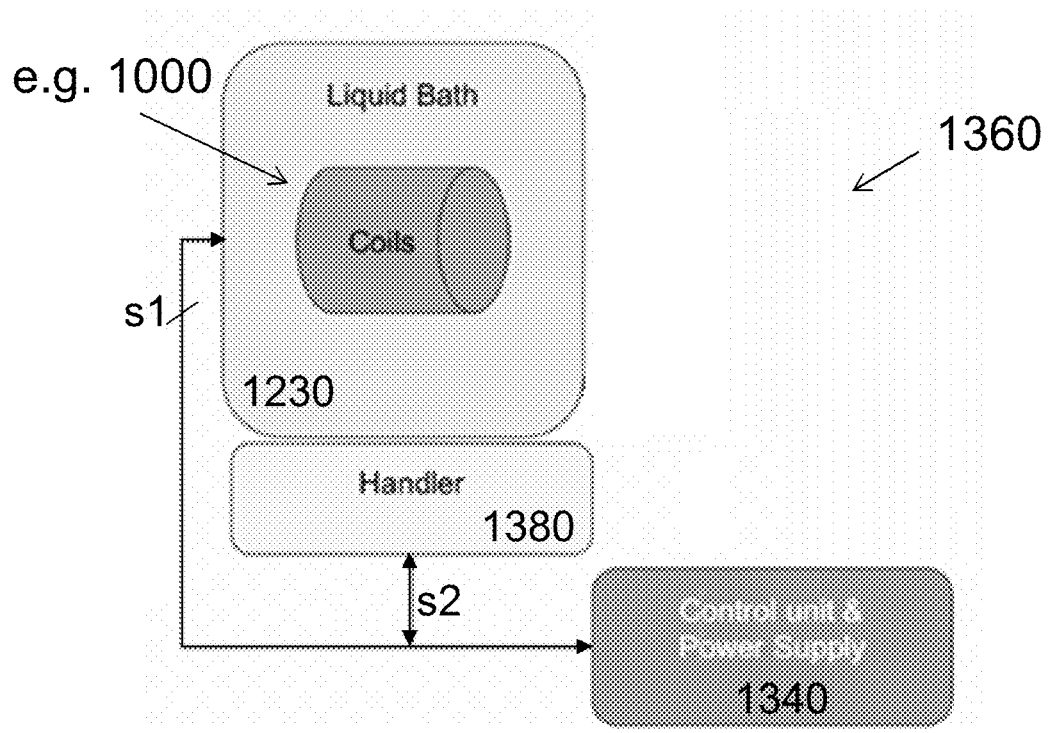
FIG. 13 shows a block diagram of an exemplary test system according to an embodiment of the present invention, comprising a coil arrangement inside a container further containing a liquid, and a "chip handler" (or "device positioner") for selectively inserting and removing packaged semiconductor devices to be tested. The test system also comprises heating means and/or cooling means for heating and/or cooling the liquid, and an electrical control unit for causing currents to flow in the coils and/or for controlling the heating means and/or cooling means, and/or for controlling the handler.

FIG. 13 shows a high-level block-diagram of an exemplary test system 1360 according to an embodiment of the present invention, comprising a coil arrangement (for example the coil arrangement 1000 of FIG. 10) inside a container 1230, the container further comprising a liquid.

The test system 1360 of FIG. 13 further comprises a "chip handler" or "positioning device" 1380 adapted or configured for selectively inserting and removing packaged semiconductor devices to be tested in and out of the cavities q1-q4 of the coil arrangement 1000, and an electrical control unit 1340 for causing currents to flow in the coils (schematically indicated by signals s1). The container 1230 may further comprise at least one liquid level sensor, and/or at least one temperature sensor (not shown), and the electrical control unit 1340 may be further adapted to readout these sensors (optionally included in the signals s1). The electrical control unit 1340 may be communicatively coupled to the positioning device 1380, and may be further adapted for controlling the positioning device 1380 (schematically indicated by signals s2).

The test system 1360 of FIG. 13 may further comprise heating means and/or cooling means for heating and/or cooling the liquid, and may comprise one or more temperature sensors. The electrical control unit 1340 may be further adapted for reading the one or more temperature sensors, and for controlling the heating means and/or the cooling means (not shown).

More specifically, the electrical control unit 1340 of the test system 1360 may be adapted for performing at least some, but preferably all of the following steps:
 a) instructing the positioning device 1380 to take one or more new packaged device(s) to be tested;
 b) instructing the positioning device 1380 to control a local temperature of the device(s) to be tested; (the positioning device 1380 may for example comprise local cooling or heating means) c) instructing the positioning device 1380 to insert the packaged device(s) into the at least one cavity, preferably four devices simultaneously;
 d) instructing the internal or external temperature control means of the test arrangement 1360 to control a temperature of the test arrangement, for example to provide a liquid with a temperature in a predefined range, for example at one of three predefined temperatures;
 e) performing the following steps for each of a plurality of a set of predefined magnetic test vectors (Bx1, By1, Bz1), (Bx2, By2, Bz2), . . . (BxN, ByN, BzN), where N is for example a number in the range from 5 to 50, for example equal to about 20:
   i) calculating a plurality of currents Ix, Iy, Iz, Ixm, Iym that need to be applied to the coils to obtain said magnetic test vectors;
   ii) applying the calculated plurality of currents Ix, Iy, Iz, Ixm, Iym to the coils, thereby generating the at least one magnetic test vector inside the at least one cavity;
   iii) allowing the device(s) under test to measure the generated magnetic field vector(s) and/or to determine value(s) derived therefrom (for example a linear or angular position);
   iv) communicating with the packaged device(s) in order to obtain the measured vector data or the determined value(s) from the device(s) under test;
   v) comparing the obtained vector data or the determined value(s) with a predefined result for the specific test vector(s), and deciding whether the device(s) has/have passed or failed the test;
 f) instructing the positioning device 1380 to remove the device(s) which has/have been tested.

It is an advantage of the test system of FIG. 1360 that the liquid cannot only be used for cooling the coils, but can also be used for creating a controlled temperature inside the cavities (albeit indirectly).

In particular embodiments, step d) may comprise to provide a bath temperature Tbath=5° C. when the chip temperature Ttest=−40° C., and to provide a bath temperature Tbath=35° C. when Ttest=35° C., and to provide a bath temperature Tbath=80° C. when Ttest=160° C., but of course the present invention is not limited to this particular example.

In preferred embodiments, the temperature of the liquid inside the container 1230 and/or inside the thermal fluid tank 1370 (corresponding to the temperature inside the cavity) is controlled to be substantially the same as the temperature created by the handler/positioning device 1380 holding the packaged device(s). In this way both the temperature of the chip and the temperature of its immediate surroundings can be controlled.

FIG. 14(*e*) illustrates how a more homogeneous Bx field-component (oriented in the X-direction) can be generated at the test locations inside the cavities of the coil arrangement of FIG. 10, also showing an enlarged view of one of the cavities and a packaged chip placed therein. Or stated differently, FIG. 14(*a*) to FIG. 14(*e*) illustrates how the "sweet spot" (at which location the Bx field is most homogeneous, corresponding to the location where the Bx field reaches a local minimum) can be shifted in the X-direction for each test location.

FIG. 14(*a*) shows plots of the magnitude |Bx| of the magnetic field component Bx at various positions along the X-axis of the upper two and lower two X-coils (which is the same for symmetry-reasons), if the outer X-coils Cx1, Cx2 and the intermediate X-coils Cxm1, Cxm2 would carry the same current Ix, as is typically done in the prior art when identical coils are used, which are simply connected in series. Or stated more correctly, for the coil arrangement of FIG. 10 dimensioned according to the access windows shown in FIG. 9, this phenomenon occurs if the value of (N×I) inside the four X-coils Cx1, Cxm1, Cxm2, Cx2 is the same value, N being the number of turns, and I being the same current inside the coils.

As can be seen, each of the four upper X-coils (and likewise each of the four lower X-coils) contributes to the magnetic field component Bx according to a dome-shaped peak having a maximum in the centre of each respective coil. The combination of the two central peaks associated with the upper two intermediate X-coils (and likewise each of the lower two intermediate X-coils) cause a larger total |Bx| amplitude near a central position of the X-axis (halfway between the cavities q1, q2 and likewise halfway between the cavities q3, q4). As a consequence, the local minimum of |Bx| is not located exactly in the middle of the cavities, but the amplitude |Bx| slightly varies along the X-as (or stated in other words: has a non-zero field gradient dBx/dx), in particular at the test locations.

This is better visible in FIG. 14(b) showing an enlarged portion of the |Bx|-plot at the centre of the cavity (which is the assumed test position where the device is/are to be positioned during testing). In the particular example shown in FIG. 14(b), the value of |Bx| varies from about 221.5 Gauss (22.15 mTesla) to about 220.6 Gauss (22.06 mTesla) if the X-position of the sensitive location of the packaged IC (indicated by a white arrow in FIG. 14b) varies from X=59.5 mm to 60.5 mm. While this |Bx| variation at the location X=60.0±0.5 mm is only about 0.5%, it is not perfect, and it limits the achievable accuracy.

The inventors wanted to further improve the accuracy of the measurement, and came to the idea of modifying the system such that the magnetic field component Bx would be more homogeneous near the envisioned test-location (in the example located at X=60.0 mm) by injecting different currents in the outer X-coils and the intermediate X-coils.

FIG. 14(c) shows how a current Ixm injected in the intermediate X-coils Cxm1, Cxm2 smaller than a current Ix (e.g. in the range from about 55% to about 95% thereof) injected in the outer X-coils Cx1, Cx2 reduces the amplitude of the two central peaks of |Bx|, and thereby slightly shifts the local minimum of the Bx field component inside the cavity q2 to the left (and likewise also shifts the local minima of the Bx fields in the other cavities q1, q3, q4 towards the centre of the coil arrangement).

As can be seen in FIG. 14(d) showing an enlarged portion of the |Bx| plot near the test-location where the packaged device to be tested is to be positioned), the field Bx is much more homogeneous near the "test site", as compared to FIG. 14(b). Indeed, in the specific example of FIG. 14(d) the value of |Bx| varies from about 203.1 Gauss (20.31 mTesla) for X=60.0 mm to about 203.2 Gauss (20.32 mTesla) for X=59.5 mm or X=60.6 mm. Thus the homogeneity is about a factor 10 better than in FIG. 14(b), which is a significant improvement.

Thus, the inventors came to the insight that by increasing or decreasing the ratio Ixm/Ix the local minima of |Bx| can be shifted inwardly or outwardly. This allows them to provide a field component Bx that is (much) more homogeneous (smaller gradient dBx/dx) at the envisioned test locations (e.g. located at 60.0 mm).

But the inventors furthermore came to the insight that, by varying the ratio Ixm/Ix, the position of the so called "sweet spot" (where the Bx field reaches a local minimum) can also deliberately be offset from the centre of the cavity, depending on the relative position of the magnetic sensors relative to the package, or depending on the kind of package itself. This makes the test-equipment not only much more accurate, but also much more flexible or much more versatile.

Moreover, it is pointed out that this "(re)positioning of the sweet spot" of the Bx-component as a function of the package, or as a function of the relatively position of the magnetic sensors inside the package, can be performed in an electrical way, not in a mechanical way (no physical movement of permanent magnets), which is much faster, more accurate, not subject to mechanical wear and maintenance, as compared to prior art test equipment. Moreover, this feature can even make it possible to test devices with different packages without having to mechanically modify or adjust the "handler" or "positioning means". These advantages should not be underestimated, because mechanical tolerances are much harder to control.

Referring back to the equations (4) and (5) of FIG. 11(a), it can now be understood that the value of Kx and Ky may be predefined constants, which allow to make the field more homogeneous at the test-location. But it can also be understood that the specific value of these constants Kx, Ky may be chosen or adjusted as a function of the package, or as a function of the relative position of the magnetic sensors relative to the package.

Thus, in preferred embodiments, the value of the constants Kx, Ky are configurable, for example selectable from a list, depending on the specific device to be tested. This functionality can for example be implemented in software running on a controller or processor as part of the electrical unit or the electrical control unit 1040, 1340, for example by varying one or more PWM-values associated with transistors (or bridge circuits) used for generating the currents Ix and Ixm. As mentioned before, the generation of currents in a coil using half-bridges and/or dual H-bridges and PWM-signals is well known in the art, and therefore need not be explained in further detail here.

FIG. 15(e) illustrates how in a similar manner a more homogeneous By field-component (oriented in the Y-direction) can be generated at the test locations inside the cavities q1-q4 of the coil arrangement 1000 of FIG. 10, further showing an enlarged view of one of the cavities q2 and a packaged chip placed therein. Or stated differently, FIG. 15(a) to FIG. 15(e) illustrates how the "sweet spot" (at which location the By field is most homogeneous, corresponding to the location where the By field reaches a local minimum) can be shifted in the Y-direction (up/down in FIG. 10).

FIG. 15(a) shows a plot of the magnitude |By| of the magnetic field component By at various positions along the Y-axis, if the outer Y-coils Cy1', Cy2' and the intermediate Y-coil Cym2 would carry the same current (or more correctly stated: would have the same N×I). Although there is only one intermediate Y-coil in the arrangement of FIG. 10, the individual peaks associated with each Y-coil have a larger overlap.

FIG. 15(b) shows an enlarged portion of the |By|-plot at the centre of the cavity (which is the assumed test position where the device is/are to be positioned during testing), showing a non-homogeneous By-field at the test-location, but a field having a non-zero dBy/dy field gradient. In the example, the By-field varies in the range from about 208.30 Gauss (20.830 mTesla) to about 208.65 Gauss (20.865 mTesla) in an imaginary cube at the centre position +/−0.5 mm.

FIG. 15(c) shows plots of the magnitude of the magnetic field component By at various positions along the Y-axis, if the intermediate Y-coil Cym2 (and likewise also Cym1) carries a smaller current than the outer Y-coils (e.g. in the range from about 55% to about 95% thereof), as is used in some embodiments of the present invention. As indicated in the figure, as the ratio of Iym/Iy decreases (or actually: as the ratio of (Nym×Iym)/(Ny×Iy) decreases, where Nym is the number of turns of the intermediate Y-coil, and Ny is the number of turns of the outer Y-coil, but normally Ny and Nym are fixed after assembly), the position of the local minimum of the By-field moves inwards. By choosing an appropriate ratio, or value Ky in formula [5] of FIG. 11(a), the position of the local minimum of |By| will be at the envisioned test-location, e.g. in the centre of the cavity q2, or deliberately offset therefrom, e.g. depending on the specific package and/or the relative position of the magnetic sensor with respect to the package, similar as described above for the Bx field component.

FIG. 15(d) shows an enlarged portion of the |By|-plot at the test-location (assumed in the centre of the cavity q2), showing a highly homogeneous field having a reduced or substantially zero dBy/dy field gradient, in the example varying in the range from about 208.80 Gauss (20.88 mTesla) to about 208.85 Gauss (20.885 mTesla).

While not explicitly mentioned above, and referring to FIG. 10, it was assumed that the currents Ix and Ixm injected in the upper X-coils Cx1, Cxm1, Cxm2, Cx2 and in the lower X-coils Cx1', Cxm1', Cxm2', Cx2' created a magnetic field component Bx pointing in the same direction (e.g. both pointing to the right, i.e. in the direction of the positive X-axis, or both pointing to the left, i.e. in the direction of the negative X-axis). And likewise, it was assumed that the currents Iy and Iym injected in the Y-coils Cy1, Cym1, Cy2 on the left of FIG. 10, and the Y-coils Cy1', Cym2', Cy2' on the right in FIG. 10) created a magnetic field component By pointing in the same direction (e.g. both pointing upwards, i.e. in the direction of the positive Y-axis, or both pointing downwards, i.e. in the direction of the negative Y-axis). And likewise, it was assumed that the current Iz injected in the four Z-coils created a magnetic field component in the four test sites which all pointed in the same direction, e.g. all pointing in the direction of the positive Z-axis, or all pointing in the direction of the negative Z-axis. This offers the advantage that the magnetic field vectors in each of the four test sites are substantially identical, thus (assuming that the chip packages are all oriented in the same manner), the same test vector is applied to each of the packages.

However, the inventors came to the idea of experimenting what would happen if the Bx-field of the upper X-coils and the lower X-coils would not be the same, but opposite, and what would happen if the By-field generated by the left Y-coils and the right Y-coils would not be the same but opposite, and what would happen if the Bz-field of some of the Cz coils would be inverted. They surprisingly found that the amount of electrical energy required to generate a magnetic field of a particular strength in each of the test sites was significantly reduced by about 10% to 15%. This was totally unexpected. And perhaps more importantly than the mere energy savings, it meant that less power was dissipated (thus less heat created) in the coils when measuring the same field strength. As mentioned above, heat considerations were an important factor in the design and/or dimensioning of the coil arrangement of FIG. 10, in particular when trying to make a highly compact structure. This energy-saving allows to use a longer duty cycle, or test higher magnetic field strength, etc.

FIG. 16(a) to FIG. 16(d) illustrate this principle, which is referred to herein as "easy looping of the flux-lines" which can be used in embodiments of the present invention.

FIG. 16(a) illustrates an example of easy looping of the field lines generated by the X-coils.

FIG. 16(b) illustrates an example of easy looping of the field lines generated by the Y-coils.

Figure 16C:
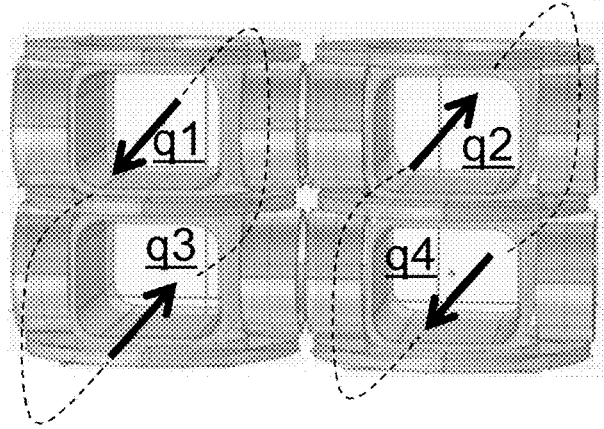
FIG. 16(c) and FIG. 16(d) illustrate two examples of easy looping of the field lines generated by the Z-coils.

FIG. 16(c) illustrates an example of easy looping of the field lines generated by the Z-coils.

Figure 16D:
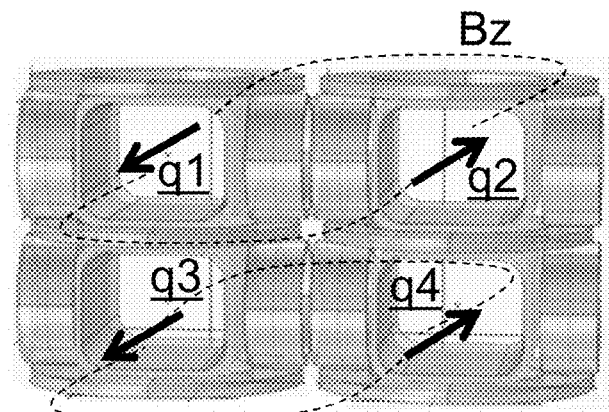
Figure 17A:
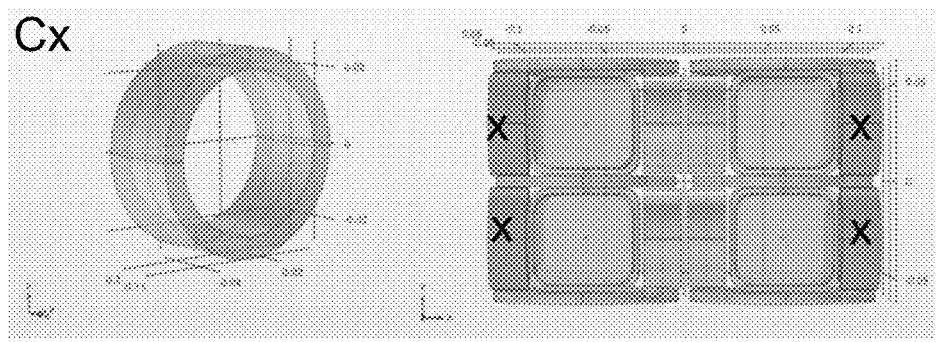
FIG. 17(a) to FIG. 17(e) show optimized coils for a preferred embodiment of the coil arrangement of FIG. 10, taking into account the constraints shown in FIG. 9.
Figure 17B:
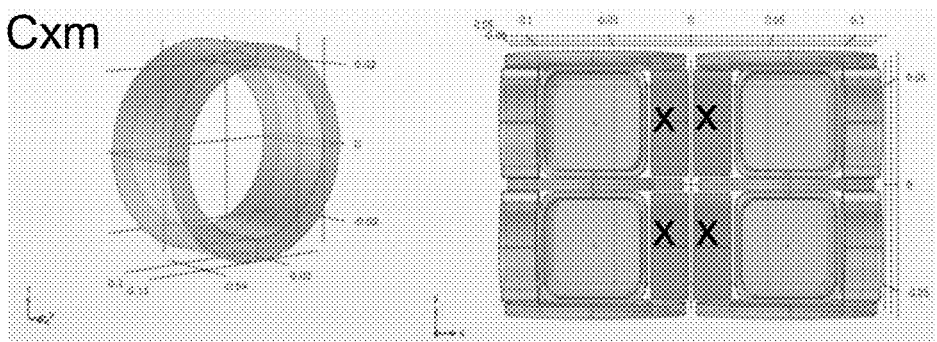
Figure 17C:
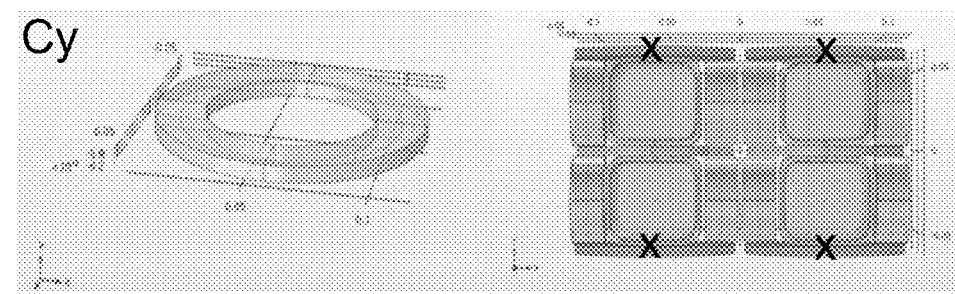
Figure 17D:
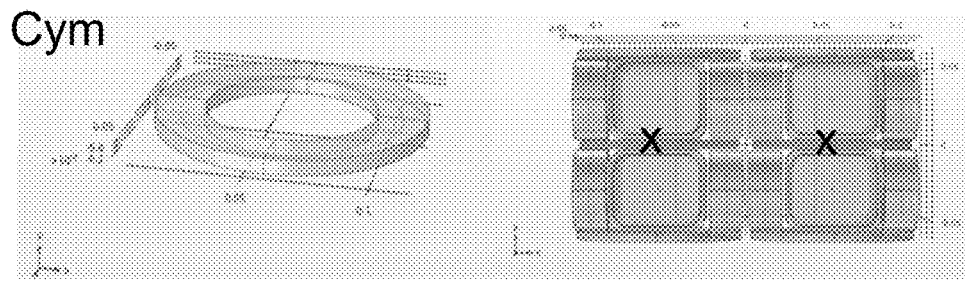
Figure 17E:
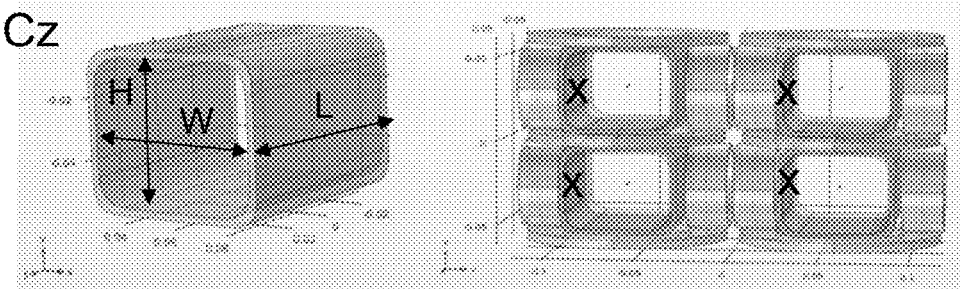

FIG. 16(d) illustrates another example of easy looping of the field lines generated by the Z-coils. The point is that the Bz-vectors are not all oriented in the same direction. For the particular system that was tested, the configuration shown in FIG. 16(c) was the most efficient one.

FIG. 17(a) to FIG. 17(e) show optimized coils for a preferred embodiment of the coil arrangement of FIG. 10, taking into account the constraints shown in FIG. 9. The solutions presented below were found by using an iterative approach, wherein for each coil, values were found for the outer diameter ("Dout") and the inner diameter ("Din") and the length ("L") of the coil, which yield the minimum field discrepancy (or maximum field homogeneity), taking into account the geometrical constraints and the max. allowed power dissipation constraints.

Instead of length (L) also the number of turns (N) could have been used as a variable. It is noted that each step required several simulations of the field topology in the test region, in order to be able to determine the field homogeneity/inhomogeneity. In order to reduce the number of simulations (which are very time consuming), not all potential combinations of (Dout, Din, L) were simulated at fine granularity (or high accuracy), but a stepwise approach was used wherein the optimum solution range was gradually reduced, and the granularity was decreased (increasing accuracy). For each potential candidate (Dout, Din, L) an approximate simulation was performed using an imaginary coil having a "mid ratio radius" meaning a radius R for which (Dout/R=R/Din).

In an exemplary coil arrangement having the configuration as shown in FIG. 10, the coils have the following approximate characteristics:

|  | outer X-coils | intermediate X-coils | outer Y-coils | intermediate Y-coils | Z-coils |
|---|---|---|---|---|---|
| R_inner [mm] | R: 16.0 | R: 16.0 | R: 36.0 | R: 36.0 |  |
| X_inner [mm] |  |  |  |  | X: 57.0 |
| Y_inner [mm] |  |  |  |  | Y: 45.0 |
| R_outer [mm] | R: 25.0 | R: 25.0 | R: 55.0 | R: 55.0 |  |
| X_outer [mm] |  |  |  |  | X: 62.0 |
| Y_outer [mm] |  |  |  |  | Y: 50.0 |
| Length [mm] | 23.0 | 23.0 | 5.2 | 5.2 | 78 |
| cross section of the wires | Round | Round | Foil | Foil | Round |
| nr of turns | 518 | 518 | 135 | 135 | 512 |
| R [Ohm] | 4.6 Ω | 4.6 Ω | 1.6 Ω | 1.6 Ω | 7.05 Ω |

|  | outer X-coils | intermediate X-coils | outer Y-coils | intermediate Y-coils | Z-coils |
|---|---|---|---|---|---|
| (at 20° C.) | | | | | |
| I [Amp] (for 20 mTesla) | 8 A | 6.8 A | 8.9 A | 7.6 A | 2.9 A |
| Self-Inductance L_self [mH] | 17 mH | 17 mH | 5.2 mH | 5.2 mH | 2.7 mH |
| Time constant Tau [ms] = L/r | 3.7 ms | 3.7 ms | 3.25 ms | 3.25 ms | 0.4 ms |
| Pmax_instant (Watt) in 1 coil | 294 W | 213 W | 126 W | 92 W | 59 W |
| P_joule at 30% duty cycle [Watt] | 88 W | 46 W | 38 W | 28 W | 18 W |

FIG. 18 and FIG. 19 show simulation results.

Figure 18A:
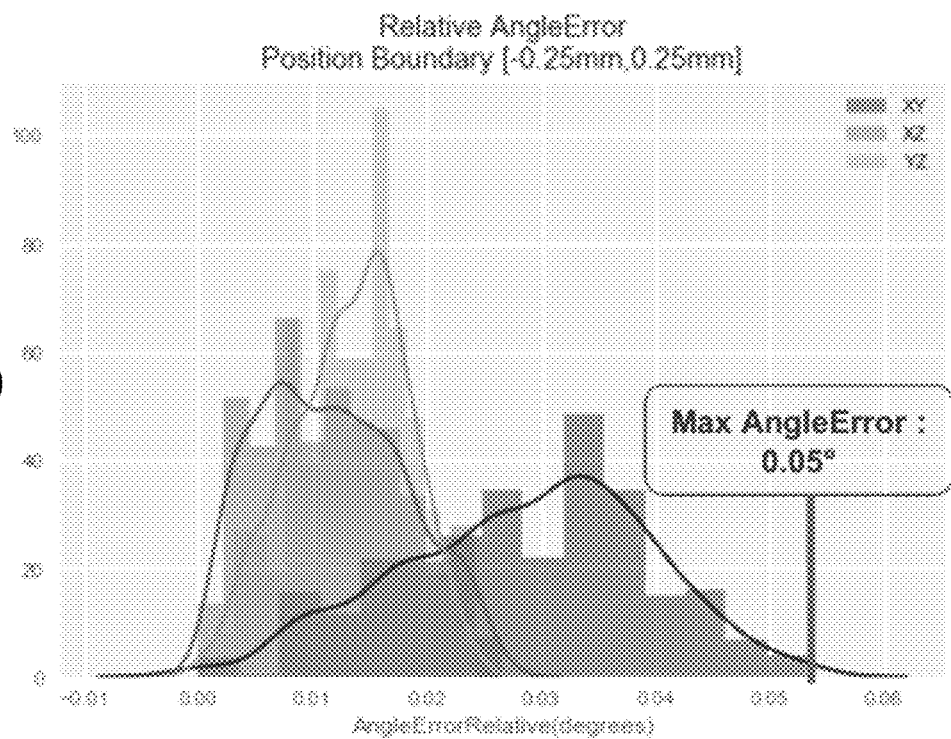
FIG. 18(a) shows the maximum angular position error of an exemplary sensor device having a magnetic centre position, which, after being inserted into the cavity, is located within a cube of [−0.25 to +0.25 mm] around a predefined test position (also referred to herein as "test-site"), for a test-system according to an embodiment of the present invention.
Figure 18B:
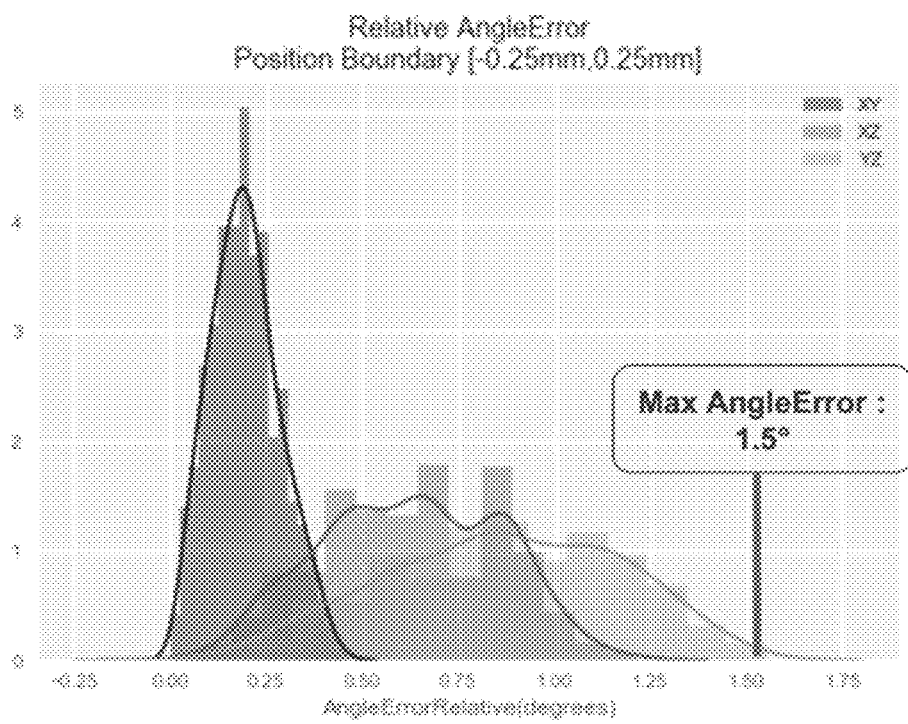
FIG. 18(b) shows the maximum angular position error of the same sensor device when using an existing in-house test-system with permanent magnets.

FIG. 18(a) shows the maximum angular position error of an exemplary sensor device having a magnetic centre position, located at the sweet spot of a test-equipment according to the present invention, within a tolerance margin of ±0.25 mm in each direction X, Y, Z. As can be seen, the worst case angular error is about 0.05°. FIG. 18(b) shows the maximum angular position error when testing the same sensor device using an existing in-house test-system with mechanically movable permanent magnets. As can be seen, the worst case angular error is about 1.5°. Thus the test-system according to embodiments of the present invention is clearly far more accurate.

Figure 19A:
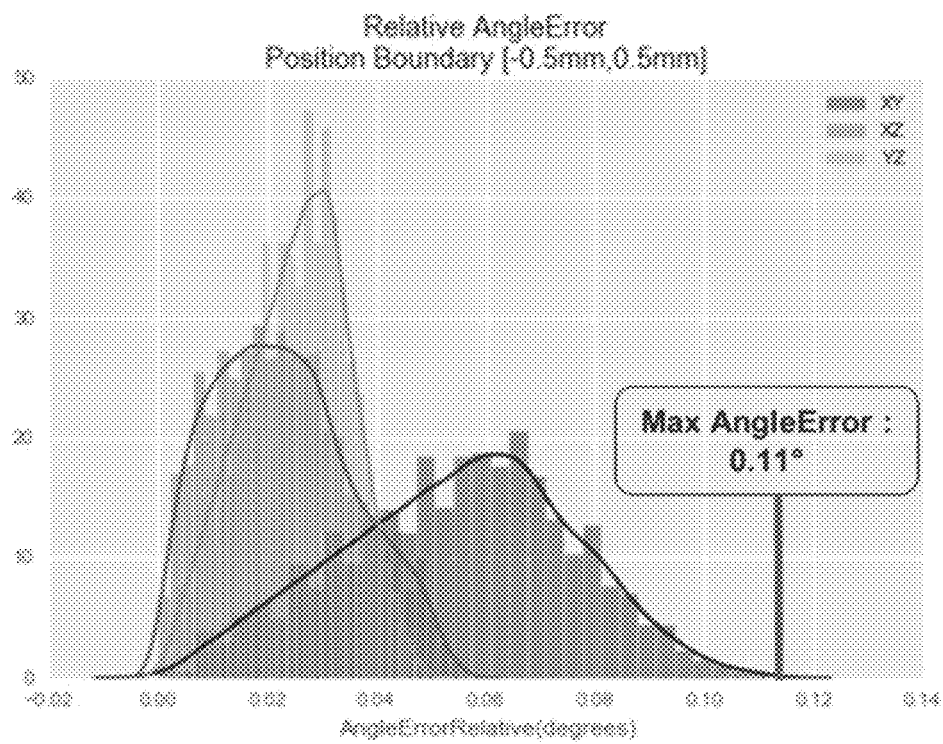
FIG. 19(a) shows the maximum angular position error of an exemplary sensor device having a magnetic centre position, which, after being inserted into the cavity, is located within a cube of [−0.50 to +0.50 mm] around a predefined test position (also referred to herein as "test-site"), for a test-system according to an embodiment of the present invention.
Figure 19B:
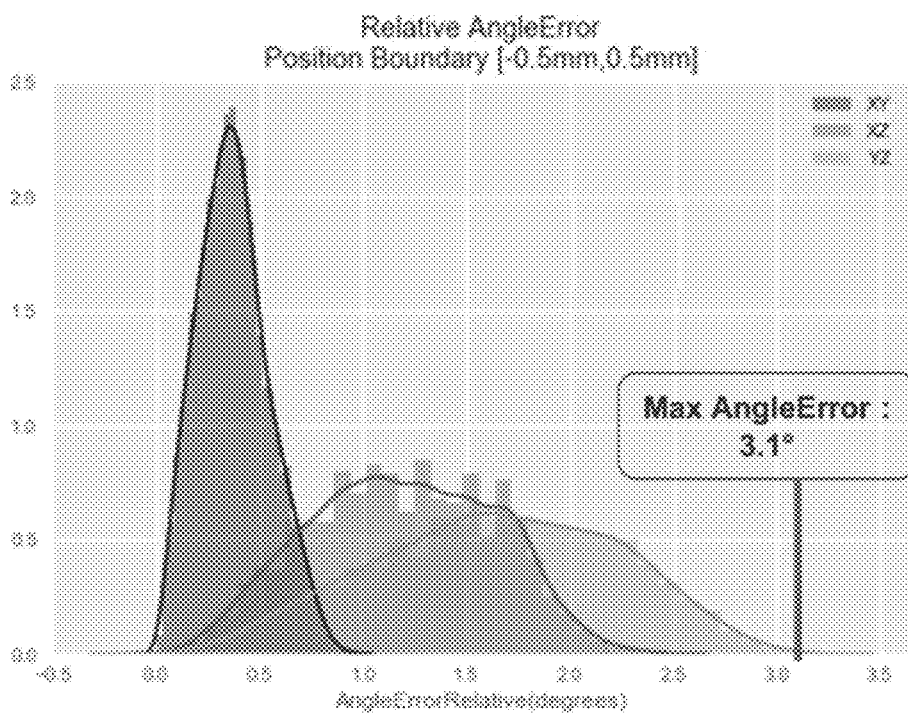
FIG. 19(b) shows the maximum angular position error of the same sensor device when using an existing in-house test-system with permanent magnets.

FIG. 19(a) shows the maximum angular position error of an exemplary sensor device having a magnetic centre position, located at the sweet spot of a test-equipment according to the present invention, within a tolerance margin of ±0.50 mm in each direction X, Y, Z. As can be seen, the worst case angular error is about 0.11°. FIG. 19(b) shows the maximum angular position error when testing the same sensor device using an existing in-house test-system with mechanically movable permanent magnets. As can be seen, the worst-case angular error is about 3.1°. Thus, the test-system according to embodiments of the present invention is clearly far more accurate.

Figure 20:
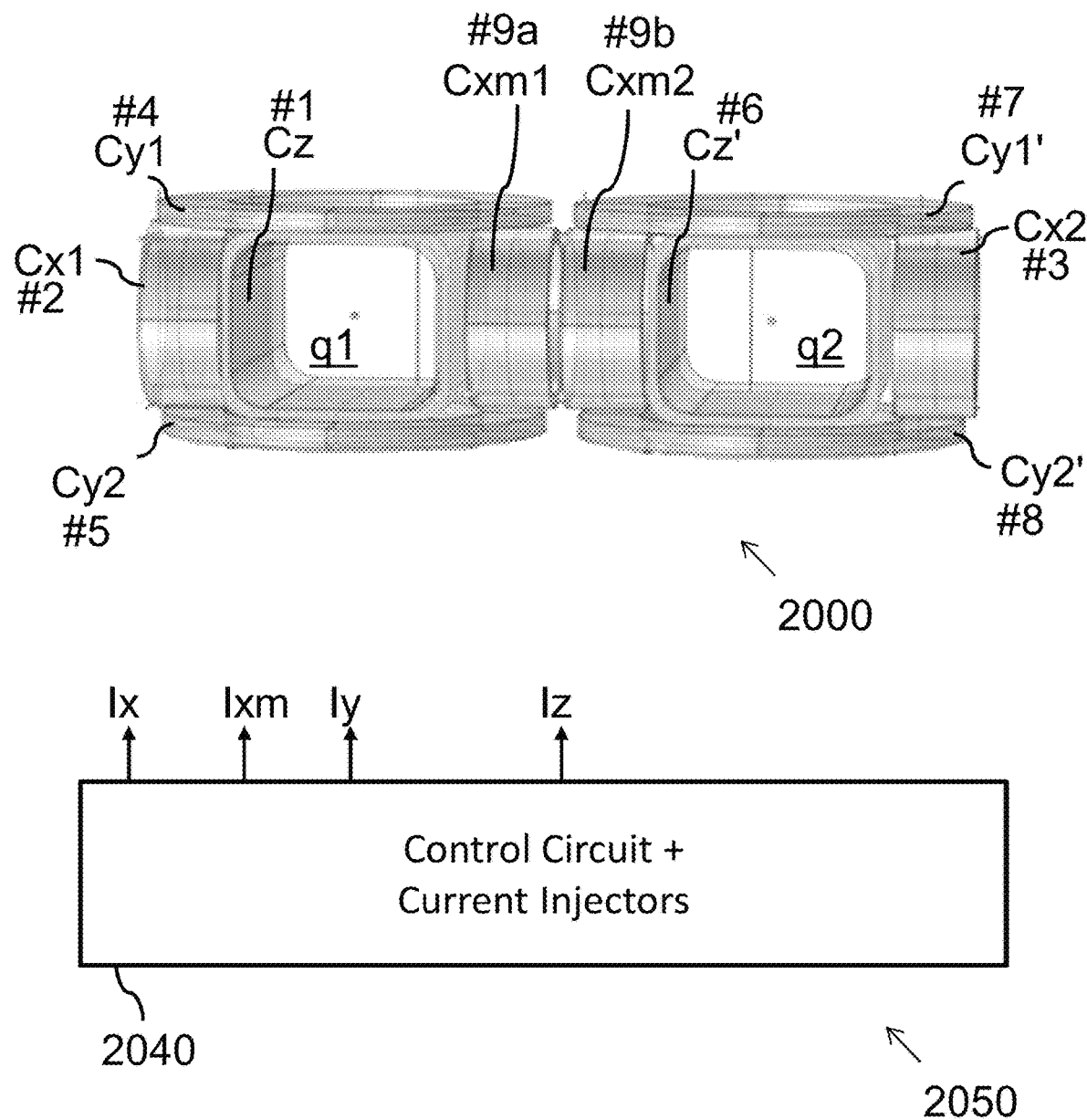
FIG. 20 shows another test-system according to an embodiment of the present invention, which can be seen as a variant of the test-system of FIG. 10.

FIG. 20 shows another test-system 2050 according to an embodiment of the present invention, which can be seen as a variant of the test-system of FIG. 10, allowing to simultaneously test two packaged devices. The main purpose of this embodiment is to show that many of the principles disclosed in the present invention are also applicable for a test system having only two cavities q1, q2 rather than four (as shown in FIG. 10). For example, the technique of shifting the sweet spot in the X-direction works in exactly the same way as described above and illustrated in FIG. 14, and also the technique of "easy looping the flux lines" can be applied to the Y-coils and to the Z-coils.

It shall be clear to the skilled person that test-systems with exactly three cavities (1×3, not shown), or with more than four cavities will also work, for example a test system with six cavities (2×3) or eight cavities (2×4) will also work.

While individual features are explained in different drawings and different embodiments of the present invention, it is contemplated that features of different embodiments can be combined, as would be obvious to the skilled person, when reading this document.

The invention claimed is:

1. A coil arrangement for generating a magnetic field with a first configurable 3D magnetic field vector at a first predefined location inside a first cavity inside the coil arrangement, the first cavity being adapted for receiving a first device to be tested and having an opening for allowing insertion and removal of said device, the coil arrangement comprising:

a first coil (Cz) in a form of a solenoid having a tubular shape forming or surrounding the first cavity, the first coil having a first axis oriented in a first direction (Z) and being adapted for generating a first magnetic field component in the first-direction (Z) at said first predefined location;

a second coil (Cx1) and a third coil (Cx2) arranged on opposite sides of the first cavity, the second and third coil having a common axis oriented in a second direction (X) perpendicular to the first direction (Z), the second and third coil being adapted for generating a second magnetic field component in the second direction at said first predefined location;

a fourth coil (Cy1) and a fifth coil (Cy2) arranged on opposite sides of the first cavity, the fourth and fifth coil having a common axis oriented in a third direction (Y) perpendicular to the first direction (Z) and perpendicular to the second direction (X), the fourth and fifth coil being adapted for generating a third magnetic field component in the third direction at said first predefined location;

wherein the coil arrangement is further adapted for generating a second configurable 3D magnetic field vector at a second predefined location inside a second cavity, the second cavity having a shape and size for accommodating a second device to be tested and having a second opening for allowing insertion or removal of said second device, the coil arrangement further comprising:

a sixth coil (Cz') in a form of a solenoid having a tubular shape forming or surrounding the second cavity, the sixth coil (Cz') having an axis parallel to the first direction (Z), and being arranged between the first coil (Cz) and the fifth coil (Cy2); and a seventh coil (Cx1') and an eight coil (Cx2') arranged on opposite sides of the second cavity, each of these coils having an axis oriented in the second direction (X); and at least one intermediate coil (Cym) arranged between the first coil (Cz) and the sixth coil (Cz'), the at least one intermediate coil (Cym) and the fourth coil (Cy1) and the fifth coil (Cy2) having a common axis.

2. The coil arrangement according to claim 1 comprising only nonferromagnetic metals or alloys.

3. The coil arrangement according to claim 1, wherein each of the second and third coil (Cx1, Cx2) has a cylindrical shape or a ring shape with a first outer diameter, and a first length smaller than 80% of said first outer diameter of the second and third coil (Cx1, Cx2); and wherein each of the fourth and fifth coil (Cy1, Cy2) has a cylindrical shape or a ring shape with a second outer diameter, and a second length smaller than 20% of said second outer diameter of the fourth and fifth coil (Cy1, Cy2).

4. The coil arrangement according to claim 3, wherein the fourth coil (Cy1) and the first coil (Cz) and the fifth coil (Cy2) are stacked along the third axis (Y), and the second outer diameter of the fourth and fifth coil is at least 80% of an outer width of the first coil (Cz); and
wherein said stack (Cy1, Cz, Cy2) is sandwiched in the second direction (X) between the second and third coil (Cx1, Cx2), the first outer diameter of the second and third coil being at least 80% of a height of the stack in the second direction (X).

5. The coil arrangement according to claim 3, wherein the second coil (Cx1) and the first coil (Cz) and the third coil (Cx2) are stacked along the second axis (X), and the first outer diameter of the second and third coil (Cx1, Cx2) is at least 80% of an outer height of the first coil (Cz); and
wherein said stack (Cx1, Cz, Cx2) is sandwiched in the third direction (Y) between the fourth and fifth coil (Cy1, Cy2), the second outer diameter of the fourth and fifth coil being at least 80% of an outer width of the stack in the third direction (Y).

6. A test arrangement comprising:
a coil arrangement according to claim 1; and
a container having a size and dimensions for accommodating the coil arrangement, and being adapted for furthermore containing a liquid for increasing and/or decreasing a temperature of the coil arrangement;
the container having at least one wall comprising at least one opening for providing access to the at least one cavity.

7. A test system comprising:
a coil arrangement according to claim 1; and
an electrical unit for providing a plurality of currents to said coils for generating at least one of the first configurable magnetic field vector at said first predefined location inside said first cavity and the second configurable magnetic field vector at said second predefined location inside said second cavity, the electrical unit comprising:
a first current source adapted to provide a first selectable or configurable current in at least the first coil (Cz) for generating a magnetic field component oriented in the first direction (Z); and
a second current source adapted to provide a second selectable or configurable current in at least the second and third coil (Cx1, Cx2) for generating a magnetic field component oriented in the second direction (X); and
a third current source adapted to provide a third selectable or configurable current in the fourth and fifth coil (Cy1, Cy2) for generating a magnetic field component oriented in the third direction (Y); and
a controller for controlling the first, second and third current source so as to generate at least one of the first configurable magnetic field vector and the second configurable magnetic field vector.

8. The test system according to claim 7,
wherein the first current source is further adapted for also providing the first current to the sixth coil (Cz'); and
wherein the second current source is further adapted for also providing the second current to the seventh coil (Cx1') and eighth coil (Cx2'); and
wherein the test system further comprises a fourth current source for providing a fourth selectable or configurable current to the at least one intermediate coil (Cym); and
wherein the controller is further adapted for controlling the first, second, third and fourth current sources for simultaneously generating the first magnetic field vector at the first predefined location inside the first cavity and the second magnetic field vector at the second predefined location inside the second cavity.

9. The test system according to claim 7, further comprising a positioning mechanism having at least one movable element comprising a holder for holding a device to be tested, and for selectively moving the holder toward the first predefined location inside the first cavity, away from the first cavity, toward the second predefined location inside the second cavity, or away from the second cavity.

10. A coil arrangement for generating a magnetic field with a first configurable 3D magnetic field vector at a first predefined location inside a first cavity inside the coil arrangement, the first cavity being adapted for receiving a first device to be tested and having an opening for allowing insertion and removal of said first device, the coil arrangement comprising:
a first coil (Cz) in a form of a solenoid having a tubular shape forming or surrounding the first cavity, the first coil having a first axis oriented in a first direction (Z) and being adapted for generating a first magnetic field component in the first-direction (Z) at said first predefined location;
a second coil (Cx1) and a third coil (Cx2) arranged on opposite sides of the first cavity, the second and third coil having a common axis oriented in a second direction (X) perpendicular to the first direction (Z), the second and third coil being adapted for generating a second magnetic field component in the second direction at said first predefined location;
a fourth coil (Cy1) and a fifth coil (Cy2) arranged on opposite sides of the first cavity, the fourth and fifth coil having a common axis oriented in a third direction (Y) perpendicular to the first direction (Z) and perpendicular to the second direction (X), the fourth and fifth coil being adapted for generating a third magnetic field component in the third direction at said first predefined location;
wherein the coil arrangement is further adapted for also generating a second configurable 3D magnetic field vector at a second predefined location inside a second cavity, the second cavity having a shape and size for accommodating a second device to be tested and having a second opening for allowing insertion or removal of said second device, the coil arrangement further comprising:
a sixth coil (Cz') in a form of a solenoid having a tubular shape forming or surrounding the second cavity, the sixth coil (Cz') having an axis parallel to the first direction (Z), and being arranged between the first coil (Cz) and the third coil (Cx2); and
a seventh coil (Cy1') and an eighth coil (Cy2') arranged on opposite sides of the second cavity, each of these coils having an axis oriented in the third direction (Y); and
at least one intermediate coil (Cxm; Cxm1, Cxm2) arranged between the first coil (Cz) and the sixth coil (Cz'), the at least one intermediate coil (Cxm; Cxm1, Cxm2) and the second coil (Cx1) and the third coil (Cx2) having a common axis.

11. The coil arrangement according to claim 10 comprising only nonferromagnetic metals or alloys.

12. The coil arrangement according to claim 10, wherein each of the second and third coil (Cx1, Cx2) has a cylindrical shape or a ring shape with a first outer diameter, and a first length smaller than 80% of said first outer diameter of the second and third coil (Cx1, Cx2); and
  wherein each of the fourth and fifth coil (Cy1, Cy2) has a cylindrical shape or a ring shape with a second outer diameter, and a second length smaller than 20% of said second outer diameter of the fourth and fifth coil (Cy1, Cy2).

13. The coil arrangement according to claim 12, wherein the fourth coil (Cy1) and the first coil (Cz) and the fifth coil (Cy2) are stacked along the third axis (Y), and the second outer diameter of the fourth and fifth coil is at least 80% of an outer width of the first coil (Cz); and
  wherein said stack (Cy1, Cz, Cy2) is sandwiched in the second direction (X) between the second and third coil (Cx1, Cx2), the first outer diameter of the second and third coil being at least 80% of a height of the stack in the second direction (X).

14. The coil arrangement according to claim 12, wherein the second coil (Cx1) and the first coil (Cz) and the third coil (Cx2) are stacked along the second axis (X), and the first outer diameter of the second and third coil (Cx1, Cx2) is at least 80% of an outer height of the first coil (Cz); and
  wherein said stack (Cx1, Cz, Cx2) is sandwiched in the third direction (Y) between the fourth and fifth coil (Cy1, Cy2), the second outer diameter of the fourth and fifth coil being at least 80% of an outer width of the stack in the third direction (Y).

15. A test arrangement comprising:
  a coil arrangement according to claim 10; and
  a container having a size and dimensions for accommodating the coil arrangement, and being adapted for furthermore containing a liquid for increasing and/or decreasing a temperature of the coil arrangement;
  the container having at least one wall comprising at least one opening for providing access to the at least one cavity.

16. A test system comprising:
  a coil arrangement according to claim 10; and
  an electrical unit for providing a plurality of currents to said coils for generating at least one of the first configurable magnetic field vector at said first predefined location inside said first cavity and the second configurable magnetic field vector at said second predefined location inside said second cavity, the electrical unit comprising:
  a first current source adapted to provide a first selectable or configurable current in at least the first coil (Cz) for generating a magnetic field component oriented in the first direction (Z); and
  a second current source adapted to provide a second selectable or configurable current in at least the second and third coil (Cx1, Cx2) for generating a magnetic field component oriented in the second direction (X); and
  a third current source adapted to provide a third selectable or configurable current in the fourth and fifth coil (Cy1, Cy2) for generating a magnetic field component oriented in the third direction (Y); and
  a controller for controlling the first, second and third current source so as to generate at least one of the first configurable magnetic field vector at the first predefined location inside the first cavity and the second configurable magnetic field vector at the second predefined location inside the second cavity.

17. The test system according to claim 16, wherein the first current source is further adapted for also providing the first current to the sixth coil (Cz'); and
  wherein the third current source is further adapted for also providing the third current to the seventh coil (Cy1') and eighth coil (Cy2'); and
  wherein the test system further comprises a fourth current source for providing a fourth selectable or configurable current to the at least one intermediate coil (Cxm; Cxm1, Cxm2); and
  wherein the controller is further adapted for controlling the first, second, third and fourth current sources for simultaneously generating the first magnetic field vector at the first predefined location inside the first cavity and the second magnetic field vector at the second predefined location inside the second cavity.

18. The test system according to claim 16, further comprising a positioning mechanism having at least one movable element comprising a holder for holding a device to be tested, and for selectively moving the holder toward the first predefined location inside the first cavity, away from the first cavity, toward the second predefined location inside the second cavity, or away from the second cavity.

19. A coil arrangement for generating a magnetic field with a first configurable 3D magnetic field vector at a first predefined location inside a first cavity inside the coil arrangement, the first cavity being adapted for receiving a first device to be tested and having an opening for allowing insertion and removal of said first device, the coil arrangement comprising:
  a first coil (Cz) in a form of a solenoid having a tubular shape forming or surrounding the first cavity, the first coil having a first axis oriented in a first direction (Z) and being adapted for generating a first magnetic field component in the first-direction (Z) at said first predefined location;
  a second coil (Cx1) and a third coil (Cx2) arranged on opposite sides of the first cavity, the second and third coil having a common axis oriented in a second direction (X) perpendicular to the first direction (Z), the second and third coil being adapted for generating a second magnetic field component in the second direction at said first predefined location;
  a fourth coil (Cy1) and a fifth coil (Cy2) arranged on opposite sides of the first cavity, the fourth and fifth coil having a common axis oriented in a third direction (Y) perpendicular to the first direction (Z) and perpendicular to the second direction (X), the fourth and fifth coil being adapted for generating a third magnetic field component in the third direction at said first predefined location;
  wherein the coil arrangement is further adapted for generating a second, third and fourth configurable 3D magnetic field vector at a second, third and fourth predefined location inside a second, third and fourth cavity, each of the cavities having a shape and size for accommodating a respective device to be tested, and having a respective opening for allowing insertion or removal of said device, the coil arrangement further comprising:
  a sixth coil (Cz') in a form of a solenoid having a tubular shape forming or surrounding the second cavity, the sixth coil (Cz') having an axis parallel to the first direction (Z), and being arranged between the first coil (Cz) and the third coil (Cx2); and a seventh coil (Cy1') and an eight coil (Cy2') arranged on opposite sides of the second cavity, each of these coils having an axis oriented in the third direction (Y); and at least one first intermediate coil (Cxm1, Cxm2) arranged between the first coil (Cz) and the sixth coil (Cz') having a common axis with the second coil (Cx1) and the third coil (Cx3); and a ninth coil (Cz") in a form of a solenoid having a tubular shape forming or surrounding the third cavity, the ninth coil (Cz") having an axis parallel to the first direction (Z), and being arranged between the first coil (Cz) and the fifth coil (Cy2); and a tenth coil (Cx1') and an eleventh coil (Cx2') arranged on opposite sides of the third cavity, each of these coils having an axis oriented in the second direction (X); and at least one second intermediate coil (Cym1) arranged between the first coil (Cz) and the ninth coil (Cz"), the at least one second intermediate coil (Cym1) and the fourth coil (Cy1) and the fifth coil (Cy2) having a common axis (Y); and a twelfth coil (Cz''') in a form of a solenoid having a tubular shape forming or surrounding the fourth cavity, the twelfth coil (Cz''') having an axis parallel to the first direction (Z), and being arranged between the ninth coil (Cz") and the eleventh coil (Cx2'); and at least one third intermediate coil (Cxm1', Cxm2') arranged between the ninth coil (Cz") and the twelfth coil (Cz'''), the at least one third intermediate coil and the tenth coil (Cx1') and the eleventh coil (Cx2') having a common axis; and at least one fourth intermediate coil (Cym2) arranged between the sixth coil (Cz') and the twelfth coil (Cz'''), the at least one fourth intermediate coil (Cym2) and the seventh coil (Cy1') and the eight coil (Cy2') having a common axis.

20. The coil arrangement according to claim 19 comprising only nonferromagnetic metals or alloys.

21. The coil arrangement according to claim 19, wherein each of the second and third coil (Cx1, Cx2) has a cylindrical shape or a ring shape with a first outer diameter, and a first length smaller than 80% of said first outer diameter of the second and third coil (Cx1, Cx2); and wherein each of the fourth and fifth coil (Cy1, Cy2) has a cylindrical shape or a ring shape with a second outer diameter, and a second length smaller than 20% of said second outer diameter of the fourth and fifth coil (Cy1, Cy2).

22. The coil arrangement according to claim 21, wherein the fourth coil (Cy1) and the first coil (Cz) and the fifth coil (Cy2) are stacked along the third axis (Y), and the second outer diameter of the fourth and fifth coil is at least 80% of an outer width of the first coil (Cz); and wherein said stack (Cy1, Cz, Cy2) is sandwiched in the second direction (X) between the second and third coil (Cx1, Cx2), the first outer diameter of the second and third coil being at least 80% of a height of the stack in the second direction (X).

23. The coil arrangement according to claim 21, wherein the second coil (Cx1) and the first coil (Cz) and the third coil (Cx2) are stacked along the second axis (X), and the first outer diameter of the second and third coil (Cx1, Cx2) is at least 80% of an outer height of the first coil (Cz); and wherein said stack (Cx1, Cz, Cx2) is sandwiched in the third direction (Y) between the fourth and fifth coil (Cy1, Cy2), the second outer diameter of the fourth and fifth coil being at least 80% of an outer width of the stack in the third direction (Y).

24. A test arrangement comprising:
a coil arrangement according to claim 19; and
a container having a size and dimensions for accommodating the coil arrangement, and being adapted for furthermore containing a liquid for increasing and/or decreasing a temperature of the coil arrangement;
the container having at least one wall comprising at least one opening for providing access to the at least one cavity.

25. A test system comprising:
a coil arrangement according to claim 19; and
an electrical unit for providing a plurality of currents to said coils for generating at least one of the first configurable magnetic field vector at said first predefined location inside said first cavity and the second configurable magnetic field vector at said second predefined location inside said second cavity, the electrical unit comprising:
a first current source adapted to provide a first selectable or configurable current in at least the first coil (Cz) for generating a magnetic field component oriented in the first direction (Z); and
a second current source adapted to provide a second selectable or configurable current in at least the second and third coil (Cx1, Cx2) for generating a magnetic field component oriented in the second direction (X); and
a third current source adapted to provide a third selectable or configurable current in the fourth and fifth coil (Cy1, Cy2) for generating a magnetic field component oriented in the third direction (Y); and
a controller for controlling the first, second and third current source so as to generate at least the first configurable magnetic field vector at the first predefined location inside the first cavity.

26. The test system according to claim 25, wherein the first current source is further adapted for also providing the first current to the sixth, ninth and twelfth coil (Cz', Cz", Cz'''); and wherein the second current source is further adapted for also providing the second current to the tenth and eleventh coil (Cx1', Cx2'); and wherein the third current source is further adapted for also providing the third current in the seventh and eighth coil (Cy1', Cy2'); and wherein the test system further comprises a fourth current source for providing a fourth current to the at least one first intermediate coil (Cxm1, Cxm2) and to the at least one third intermediate coil (Cxm1', Cxm2'); and wherein the test system further comprises a fifth current source for providing a fifth current to the at least one second intermediate coil (Cym1) and to the at least one fourth intermediate coil (Cym2); and wherein the controller is further adapted for controlling the first, second, third, fourth and fifth current sources for simultaneously generating the first magnetic field vector at the first predefined location inside the first cavity, and the second magnetic field vector at the second predefined location inside the second cavity, and the third magnetic field vector at the third predefined location inside the third cavity, and the fourth magnetic field vector at the fourth predefined location inside the fourth cavity.

27. The test system according to claim 25, further comprising a positioning mechanism having at least one movable element comprising a holder for holding a device to be tested, and for selectively moving the holder toward the first predefined location inside the first cavity, away from the first cavity, toward the second predefined location inside the second cavity, or away from the second cavity.

* * * * *